US012593579B2

(12) United States Patent
Wang et al.

(10) Patent No.: US 12,593,579 B2
(45) Date of Patent: Mar. 31, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yangpeng Wang, Beijing (CN); Fan He, Beijing (CN); Qiwei Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 424 days.

(21) Appl. No.: 18/033,363

(22) PCT Filed: Mar. 11, 2022

(86) PCT No.: PCT/CN2022/080319
§ 371 (c)(1),
(2) Date: Apr. 24, 2023

(87) PCT Pub. No.: WO2022/267559
PCT Pub. Date: Dec. 29, 2022

(65) Prior Publication Data
US 2023/0403894 A1      Dec. 14, 2023

(30) Foreign Application Priority Data

Jun. 24, 2021      (CN) .......................... 202110705468.0

(51) Int. Cl.
*H10K 59/131*       (2023.01)
*G09G 3/3233*       (2016.01)

(52) U.S. Cl.
CPC ......... *H10K 59/131* (2023.02); *G09G 3/3233* (2013.01); *G09G 2300/0819* (2013.01); (Continued)

(58) Field of Classification Search
CPC ............................................... H10K 59/00–95
See application file for complete search history.

(56) References Cited

U.S. PATENT DOCUMENTS

2003/0010990 A1      1/2003  Misawa et al.
2021/0265430 A1      8/2021  Chang et al.
(Continued)

FOREIGN PATENT DOCUMENTS

CN      110767097 A   *   2/2020   ........... H10K 59/131
CN      111180483 A        5/2020
(Continued)

OTHER PUBLICATIONS

International Search Report for PCT/CN2022/080319 Mailed Jun. 15, 2022.

*Primary Examiner* — Sanjiv D. Patel
(74) *Attorney, Agent, or Firm* — Ling Wu; Stephen Yang; Ling and Yang Intellectual Property

(57) ABSTRACT

A display substrate includes a display area and a non-display area that surrounds the display area. The display area includes a plurality of scanning lines extending in a first direction and a plurality of sub-pixels arranged in an array, and the display area includes a first display area and a second display area, wherein the first display area is located at the periphery of the second display area, and the second display area comprises a light-transmitting display area and a transition display area; the transition display area is located on a side face of the light-transmitting display area.

17 Claims, 17 Drawing Sheets

(52) U.S. Cl.
CPC . *G09G 2300/0842* (2013.01); *G09G 2310/08*
*(2013.01); *G09G 2340/0407* (2013.01)

(56) References Cited

U.S. PATENT DOCUMENTS

| | | | |
|---|---|---|---|
| 2022/0123094 A1 | 4/2022 | Qiu et al. | |
| 2022/0199710 A1 | 6/2022 | Xu et al. | |
| 2022/0262309 A1 | 8/2022 | Zhang et al. | |
| 2023/0080385 A1 | 3/2023 | Yuan et al. | |

FOREIGN PATENT DOCUMENTS

| | | | | |
|---|---|---|---|---|
| CN | 111326560 A | 6/2020 | | |
| CN | 111402743 A | 7/2020 | | |
| CN | 111489698 A | 8/2020 | | |
| CN | 112435622 A | 3/2021 | | |
| CN | 112992991 A | 6/2021 | | |
| CN | 113299201 A | 8/2021 | | |
| CN | 114783369 B | * 1/2025 | ........... | H10K 59/121 |
| JP | 01289917 A | 11/1989 | | |

* cited by examiner

1

DISPLAY SUBSTRATE AND DISPLAY APPARATUS

CROSS-REFERENCE TO RELATED APPLICATIONS

This application is a national stage application of PCT Application No. PCT/CN2022/080319, which is filed on Mar. 11, 2022 and claims priority of Chinese Patent Application No. 202110705468.0, filed to the CNIPA on Jun. 24, 2021 and entitled "Display Substrate and Display Apparatus", the content of which should be regarded as being incorporated herein by reference.

TECHNICAL FIELD

Embodiments of the present disclosure relate to, but are not limited to, the field of display technology, particularly to a display substrate and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, extremely high response speed, lightness and thinness, flexibility, and low cost. With constant development of display technologies, a flexible display that uses an OLED or a QLED as a light emitting device and performs signal control by a Thin Film Transistor (TFT for short) has become a mainstream product in the field of display at present.

At present, the concept of full-screen mobile phone has been widely concerned in the mobile phone market, and it is also the development direction of mobile phones in the future. In this full-screen mobile phone, the camera can be hidden so that the front visible area is almost all the screen, so that the user can receive a better display effect.

SUMMARY

The following is a summary of subject matter described herein in detail. The summary is not intended to limit the protection scope of claims.

In a first aspect, the present disclosure provides a display substrate, including: a display area and a non-display area surrounding the display area. The display area includes: a plurality of scan lines extending along a first direction and a plurality of sub-pixels arranged in an array. The display area includes a first display area and a second display area, wherein the first display area is located at a periphery of the second display area, and the second display area includes a light transmitting display area and a transition display area, and the transition display area is located at a side of the light transmitting display area;

the light transmitting display area includes m rows and n columns of sub-pixels, each sub-pixel located in the light transmitting display area includes a light emitting element, wherein a light emitting element of each sub-pixel of i-th row located in the light transmitting display area is electrically connected with a light emitting element of a sub-pixel of (i+1)-th row with the same color located in the light transmitting display area, and i is an odd number less than or equal to m; the transition display area includes m rows and n columns of sub-pixels, and sub-pixels of i-th row of the light transmitting display area and sub-pixels of i-th row of the transition display area are located in the same row; each sub-pixel located in the transition display area includes a pixel circuit and a light emitting element, wherein a light emitting element of each sub-pixel of i-th row located in the transition display area is electrically connected with a light emitting element of a sub-pixel of (i+1)-th row with the same color located in the transition display area; the pixel circuits and the light emitting elements of the sub-pixels of i-th row located in the transition display area are electrically connected, and a pixel circuit of a sub-pixel of (i+1)-th column and j-th column located in the transition display area is electrically connected with a light emitting element of a sub-pixel of (i+1)-th column and j-th column located in the light transmitting display area, and j is a positive integer less than or equal to n;

pixel circuits of sub-pixels of i-th row and (i+1)-th row located in the transition display area are connected with the same scan line.

In some possible implementations, the pixel circuits of the sub-pixels of i-th row and (i+1)-th row located in the transition display area are connected with the first scan line or the second scan line;

wherein, the first scan line is a scan line connected with the sub-pixels located in the first display area and in the same row as the sub-pixels of i-th row located in the transition display area; the second scan line is a scan line a scan line connected with a sub-pixel located in the first display area and in the same row as a sub-pixel of (i+1)-th row located in the transition display area.

In some possible implementations, the first display area includes a plurality of sub-pixels, each sub-pixel located in the first display area includes a pixel circuit and a light emitting element; at least three sub-pixels located in the same row form a pixel unit; the light emitting element includes an anode, an organic light emitting layer and a cathode;

an anode of a light emitting element of each sub-pixel in a pixel unit of i-th row and k-th column located in the light transmitting display area is electrically connected with an anode of a light emitting element of a sub-pixel with the same color in a pixel unit of (i+1)-th row and k-th column located in the light transmitting display area, where k is a positive integer less than or equal to K, K=n/3 or n/4;

an anode of a light emitting element of each sub-pixel in a pixel unit of i-th row and k-th column located in the transition display area is electrically connected with an anode of a light emitting element of a sub-pixel with the same color in a pixel unit of (i+1)-th row and k-th column located in the transition display area;

a pixel circuit of a sub-pixel of (i+1)-th row and j-th column located in the transition display area is electrically connected with an anode of a light emitting element of a sub-pixel of (i+1)-th row and j-th column located in the light transmitting display area;

a pixel circuit and an anode of the light emitting element of a sub-pixel located in the first display area are electrically connected.

In some possible implementations, the display substrate further includes a plurality of data lines extending along a second direction. A pixel circuit of a sub-pixel of i-th row and j-th column located in the transition display area is electrically connected with a first data line, a pixel circuit of a sub-pixel of (i+1)-th row and j-th column located in the transition display area is electrically connected with a second data line, the first direction and the second direction intersect;

wherein, the first data line is a data line connected with a pixel circuit of a sub-pixel located in the first display area and in the same column as a sub-pixel of i-th row and j-th column located in the transition display area; the second data line is a data line connected with a pixel circuit of a sub-pixel located in the first display area and in the same column as a sub-pixel of (i+1)-th row and j-th column located in the light transmitting display area.

In some possible implementations, a data connection line is also included, wherein the data connection line and the data line are arranged in different layers;

the data connection line is electrically connected with a pixel circuit of a sub-pixel of (i+1)-th row and j-th column located in the transition display area and a second data line connected with the pixel circuit of the sub-pixel of (i+1)-th row and j-th column located in the transition display area, respectively.

In some possible implementations, the light transmitting display area includes a first side and a second side that are oppositely disposed, and a third side and a fourth side oppositely disposed; the transition display area includes a first transition display area and a second transition display area;

the first transition display area is located at the first side of the light transmitting display area, the second transition display area is located at the second side of the light transmitting display area, and the first transition display area and the second transition display area are arranged along the first direction.

In some possible implementations, the number of second display areas is at least one.

In some possible implementations, when the number of second display areas is one, the first display area includes: a first normal display area, a second normal display area, a third normal display area, and a fourth normal display area;

a k-th row of the first normal display area is the same row as a k-th row of the light transmitting display area, and a k-th row of the second normal display area is the same row as a k-th row of the light transmitting display area, where k is a positive integer greater than or equal to 1 and less than or equal to m;

the first normal display area is located at a side of the first transition display area away from the light transmitting display area, and the second normal display area is located at a side of the second transition display area away from the light transmitting display area; the third normal display area is located at a third side of the light transmitting display area, and the fourth normal display area is located at a fourth side of the light transmitting display area; the third normal display area and the fourth normal display area are arranged along the second direction.

In some possible implementations, when the pixel circuits of the sub-pixels of i-th row and (i+1)-th row in the transition display area are connected with the first scan line, the first scan line includes: a first scan portion and a second scan portion arranged at intervals, the second scan line includes a third scan portion and a fourth scan portion arranged at intervals and extending along the first direction;

the first scan portion is electrically connected with the pixel circuits of the sub-pixels of i-th row and (i+1)-th row located in the first transition display area and the pixel circuits of the sub-pixels of i-th row located in the first normal display area, respectively;

the second scan portion is electrically connected with the pixel circuits of the sub-pixels of i-th row and (i+1)-th row located in the second transition display area and the pixel circuits of the sub-pixels of i-th row located in the second normal display area, respectively;

the third scan portion is electrically connected with the pixel circuits of the sub-pixels of (i+1)-th row located in the first normal display area;

the fourth scan portion is electrically connected with the pixel circuits of the sub-pixels of (i+1)-th row located in the second normal display area.

In some possible implementations, the first scan portion includes a first connection portion, a second connection portion and a third connection portion, wherein the first connection portion and the third connection portion extend along the first direction, the second connection portion extends along the second direction;

the first connection portion is electrically connected with the pixel circuits of the sub-pixels of i-th row located in the first normal display area, the pixel circuits of the sub-pixels of i-th row located in the first transition display area and the second connection portion; the second connection portion is electrically connected with the third connection portion; the third connection portion is electrically connected with the pixel circuits of the sub-pixels of (i+1)-th row located in the first transition display area;

the second scan portion includes a fourth connection portion, a fifth connection portion and a sixth connection portion, wherein the fourth connection portion and the sixth connection portion extend along the first direction and the fifth connection portion extends along the second direction;

the fourth connection portion is electrically connected with the pixel circuits of the sub-pixels of i-th row located in the second normal display area, the pixel circuits of the sub-pixels of i-th row located in the second transition display area and the fifth connection portion, respectively; the fifth connection portion is electrically connected with the sixth connection portion; the sixth connection portion is electrically connected with the pixel circuits of the sub-pixels of (i+1)-th row located in the second transition display area.

In some possible implementations, the first scan portion further includes: a seventh connection portion extending along the second direction, and the seventh connection portion is electrically connected with the first connection portion and the third connection portion, respectively;

the second scan portion further includes an eighth connection portion extending along the second direction, and the eighth connection portion is electrically connected with the fourth connection portion and the sixth connection portion, respectively.

In some possible implementation modes, the first scan line further includes a first scan connection portion.

the first scan connection portion is electrically connected with the first scan portion and the second scan portion, respectively.

In some possible implementations, the second scan line further includes: a second scan connection portion;

the second scan connection portion is electrically connected with the third scan portion and the fourth scan portion, respectively.

In some possible implementations, when the pixel circuits of the sub-pixels of i-th row and (i+1)-th row in the transition display area are connected with the second scan line, the second scan line includes: a first scan portion and a second scan portion arranged at intervals, the first scan line includes a third scan portion and a fourth scan portion arranged at intervals and extending along the first direction;

the first scan portion is electrically connected with the pixel circuits of the sub-pixels of i-th row and (i+1)-th row located in the first transition display area and the pixel circuits of the sub-pixels of (i+1)-th row located in the first normal display area, respectively;

the second scan portion is electrically connected with the pixel circuits of the sub-pixels of i-th row and (i+1)-th row located in the second transition display area and the pixel circuits of the sub-pixels of (i+1)-th row located in the second normal display area, respectively;

the third scan portion is electrically connected with the pixel circuits of the sub-pixels of i-th row located in the first normal display area;

the fourth scan portion is electrically connected with the pixel circuits of the sub-pixels of i-th row located in the second normal display area.

In some possible implementations, the first scan portion includes a first connection portion, a second connection portion and a third connection portion, the first connection portion and the third connection portion extends along the first direction, the second connection portion extends along the second direction; the first connection portion is electrically connected with the pixel circuits of the sub-pixels of (i+1)-th row located in the first normal display area, the pixel circuits of the sub-pixels of (i+1)-th row located in the first transition display area and the second connection portion; the second connection portion is electrically connected with the third connection portion; the third connection portion is electrically connected with the pixel circuits of the sub-pixels of i-th row located in the first transition display area;

the second scan portion includes a fourth connection portion, a fifth connection portion and a sixth connection portion, wherein the fourth connection portion and the sixth connection portion extend along the first direction and the fifth connection portion extends along the second direction; the fourth connection portion is electrically connected with the pixel circuits of the sub-pixels of (i+1)-th row located in the second normal display area, the pixel circuits of the sub-pixels of (i+1)-th row located in the second transition display area and the fifth connection portion, respectively; the fifth connection portion is electrically connected with the sixth connection portion; the sixth connection portion is electrically connected with the pixel circuits of the sub-pixels of i-th row located in the second transition display area.

In some possible implementations, the first scan portion further includes: a seventh connection portion extending along the second direction, and the seventh connection portion is electrically connected with the first connection portion and the third connection portion, respectively;

the second scan portion further includes an eighth connection portion extending along the second direction, and the eighth connection portion is electrically connected with the fourth connection portion and the sixth connection portion, respectively.

In some possible implementation modes, the second scan line further includes a first scan connection portion.

the first scan connection portion is electrically connected with the first scan portion and the second scan portion, respectively.

In some possible implementation modes, the first scan line further includes a second scan connection portion.

the second scan connection portion is electrically connected with the third scan portion and the fourth scan portion, respectively.

In some possible implementations, when the number of second display areas is at least two, the first display area include: a first normal display area, a second normal display area, a third normal display area, a fourth normal display area, and Q−1 fifth normal display areas; a k-th row of the first normal display area is the same row as a k-th row of the light transmitting display area, a k-th row of the second normal display area is the same row as a k-th row of the light transmitting display area, a k-th row of the fifth normal display area is the same row as a k-th row of the light transmitting display area, where k is a positive integer greater than or equal to 1 and less than or equal to m, and Q is the number of the second display area;

the first normal display area is located at a side of the first transition display area away from the light transmitting display area, and the second normal display area is located at a side of the second transition display area away from the light transmitting display area; the third normal display area is located at a third side of the light transmitting display area, and the fourth normal display area is located at a fourth side of the light transmitting display area; the third normal display area and the fourth normal display area are arranged along the second direction; an i-th fifth normal display area is located between an i-th second display area and an (i+1)-th second display area.

In some possible implementations, when the pixel circuits of the sub-pixels of i-th row and (i+1)-th row located in the transition display area are connected with the first scan line, the first scan line is respectively electrically connected with the pixel circuits of the sub-pixels of i-th row located in the first normal display area, the pixel circuits of the sub-pixels of i-th row located in the first transition display area and the second transition display area of all the second display areas, the pixel circuits of the sub-pixels of (i+1)-th row located in the first transition display area and the second transition display area of all the second display areas, the pixel circuits of the sub-pixels of i-th row of all the fifth normal display areas and the pixel circuits of the sub-pixels of i-th row located in the second normal display area;

the second scan line is electrically connected with the pixel circuits of the sub-pixels of (i+1)-th row located in the first normal display area, the pixel circuits of the sub-pixels of (i+1)-th row located in the second normal display area and the pixel circuits of the sub-pixels of (i+1)-th row located in all the fifth normal display areas;

the first scan line includes a first scan portion, Q−1 second scan portions and a third scan portion, and Q first scan connection portions;

the first scan portion is electrically connected with the pixel circuits of the sub-pixels of i-th row located in the first normal display area, and the pixel circuits of the sub-pixels of i-th row and (i+1)-th row located in the first transition display area of a first second display area;

a t-th second scan portion is electrically connected with the pixel circuits of the sub-pixels of i-th row of a t-th fifth normal display area, the pixel circuits of the sub-pixels i-th row and (i+1)-th row of the second transition display area of a t-th second display area, and the pixel circuits of the sub-pixels of i-th row and (i+1)-th row of the first transition display area of a (t+1)-th second display area, respectively, where t is a positive integer less than Q;

the third scan portion is electrically connected with the pixel circuits of the sub-pixels of i-th row and (i+1)-th row located in the second transition display area of a Q-th second display area and the sub-pixels of i-th row of the second normal display area, respectively;

a first scan connection portion is electrically connected with the first scan portion and a first second scan portion, respectively, and a t-th first scan connection portion is electrically connected with a (t−1)-th second scan portion and a t-th second scan portion, respectively; a Q-th first scan connection portion is electrically connected with a (Q−1)-th second scan portion and the third scan portion respectively;

the second scan line includes a fourth scan portion, Q−1 fifth scan portions and a sixth scan portion, and Q second scan connection portions;

the fourth scan portion is electrically connected with the pixel circuits of the sub-pixels of (i+1)-th row located in the first normal display area;

a t-th fifth scan portion is electrically connected with the pixel circuits of the sub-pixels of (i+1)-th row of a t-th fifth normal display area;

the sixth scan portion is electrically connected with the pixel circuits of the sub-pixels of (i+1)-th row located in the second first display area;

a first second scan connection portion is electrically connected with the first scan portion and a first second scan portion, respectively, and a t-th second scan connection portion is electrically connected with a (t−1)-th second scan portion and a t-th second scan portion, respectively; a Q-th second scan connection portion is electrically connected with a (Q−1)-th second scan portion and the third scan portion respectively.

In some possible implementations, when the pixel circuits of the sub-pixels of i-th row and (i+1)-th row located in the transition display area are connected with the second scan line, the first scan line is electrically connected with the pixel circuits of the sub-pixels of i-th row located in the first normal display area, the pixel circuits of the sub-pixels of i-th row located in the second normal display area and the pixel circuits of the sub-pixels of i-th row located in all the fifth normal display areas;

the second scan line is respectively connected with the pixel circuits of the sub-pixels of (i+1)-th row located in the first normal display area, the pixel circuits of the sub-pixels of i-th row and (i+1)th row located in the first transition display area and the second transition display area of all the second display areas, the pixel circuits of the sub-pixels of (i+1)-th row of all the fifth normal display areas and the pixel circuits of the sub-pixels of (i+1)-th row located in the second normal display area;

the second scan line includes a first scan portion, Q−1 second scan portions and a third scan portion, and Q first scan connection portions;

the first scan portion is electrically connected with the pixel circuits of the sub-pixels of (i+1)-th row located in the first normal display area, and the pixel circuits of the sub-pixels of i-th row and (i+1)-th row located in the first transition display area of the first second display area;

a t-th second scan portion is electrically connected with the pixel circuits of the sub-pixels of (i+1)-th row of a t-th fifth normal display area, the pixel circuits of the sub-pixels i-th row and (i+1)-th row of the second transition display area of a t-th second display area, and the pixel circuits of the sub-pixels of i-th row and (i+1)-th row of the first transition display area of a (t+1)-th second display area, respectively;

the third scan portion is electrically connected with the pixel circuits of the sub-pixels of i-th row and (i+1)-th row located in the second transition display area of a Q-th second display area and the sub-pixels of (i+1)-th row of the second normal display area, respectively;

a first scan connection portion is electrically connected with the first scan portion and a first second scan portion, respectively, and a t-th second scan connection portion is electrically connected with a (t−1)-th second scan portion and a t-th second scan portion, respectively; a Q-th second scan connection portion is electrically connected with a (Q−1)-th second scan portion and the third scan portion respectively;

the first scan line includes a fourth scan portion, Q−1 fifth scan portions, a sixth scan portion and Q second scan connection portions;

the fourth scan portion is electrically connected with the pixel circuits of the sub-pixels of i-th row located in the first normal display area;

a t-th fifth scan portion is electrically connected with the pixel circuits of the sub-pixels of i-th row of a t-th fifth normal display area;

the sixth scan portion is electrically connected with the pixel circuits of the sub-pixels of i-th row located in the second normal display area;

a first second scan connection portion is electrically connected with the first scan portion and a first second scan portion, respectively, and a t-th second scan connection portion is electrically connected with a (t−1)-th second scan portion and a t-th second scan portion, respectively; a Q-th second scan connection portion is electrically connected with a (Q−1)-th second scan portion and the third scan portion respectively.

In a second aspect, the present disclosure further provides a display apparatus, including the display substrate described above.

Other aspects may be understood upon reading and understanding the drawings and detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

DETAILED DESCRIPTION

Figure 1:
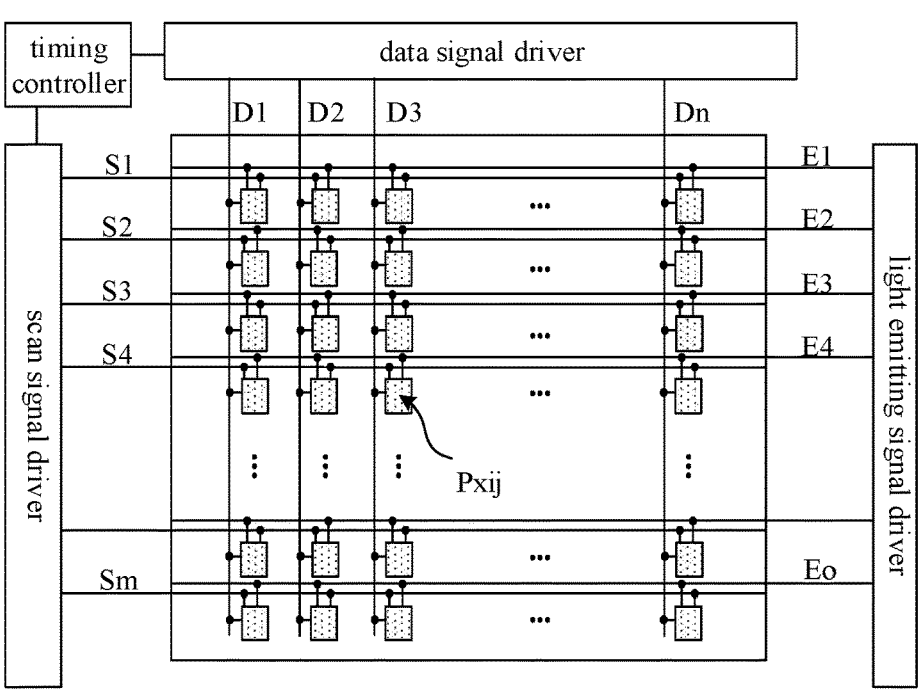
FIG. 1 is a schematic diagram of a structure of a display substrate.

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it can be a fixed connection, an active connection, or an integral connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case where constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display substrate. As shown in FIG. 1, the display substrate may include a timing controller, a data signal driver, a scan signal driver, a light emitting signal driver, and a pixel array, wherein the pixel array may include multiple scan signal lines (S1 to Sm), multiple data signal lines (D1 to Dn), multiple light emitting signal lines (E1 to Eo), and multiple sub-pixels Pxij. In an exemplary embodiment, the timing controller may provide the data signal driver with a gray-scale value and a control signal suitable for a specification of the data signal driver, may provide the scan signal driver with a clock signal, a scan starting signal, etc., suitable for a specification of the scan signal driver, and may provide the light emitting signal driver with a clock signal, an emission stopping signal, etc., suitable for a specification of the light emitting signal driver. The data driver may generate a data voltage to be provided to the data signal lines D1, D2, D3, . . . , and Dn by using the gray tone value and the control signal that are received from the timing controller. For example, the data signal driver may sample the gray scale value using a clock signal and apply a data voltage corresponding to the gray scale value to the data signal lines D1 to Dn by taking a pixel row as a unit, wherein n may be a natural number. The scan signal driver may receive the clock signal, the scan start signal, etc., from the timing controller to generate a scan signal to be provided to the scan signal lines S1, S2, S3, . . . , and Sm. For example, the scan signal driver may sequentially provide a scan signal with an on-level pulse to the scan signal lines S1 to Sm. For example, the scan signal driver may be constructed in a form of a shift register and generate a scan signal in a manner of sequentially transmitting a scan start signal provided in a form of an on-level pulse to a next-stage circuit under control of the clock signal, wherein m may be a natural number. The light emitting signal driver may receive a clock signal, a transmit stop signal, etc., from the timing controller to generate a transmit signal to be provided to the light emitting signal lines E1, E2, E3, . . . , and Eo. For example, the light emitting signal driver may sequentially provide an emission signal with an off-level pulse to the light emitting signal lines E1 to Eo. For example, the light emitting signal driver may be constructed in a form of a shift register and generate a light emitting signal in a manner of sequentially transmitting a light emitting stop signal provided in a form of an off-level pulse to a next-stage circuit under control of a clock signal, wherein o may be a natural number. The pixel array may include multiple sub-pixels Pxij. Each sub-pixel Pxij may be connected with the corresponding data signal line, the corresponding scan signal line, and the corresponding light emitting signal line. Herein, i and j may be natural numbers. The sub-pixel Pxij may refer to a sub-pixel in which a transistor is connected with an i-th scan signal line and connected with a j-th data signal line.

The full-screen display product includes a light transmitting display area for disposing an optical device and a transition display area located at a side of the light transmitting display area. In a full screen display product, the light transmitting display area and the transition display area do not display simultaneously, which affects the display effect of the display product.

Figure 2:
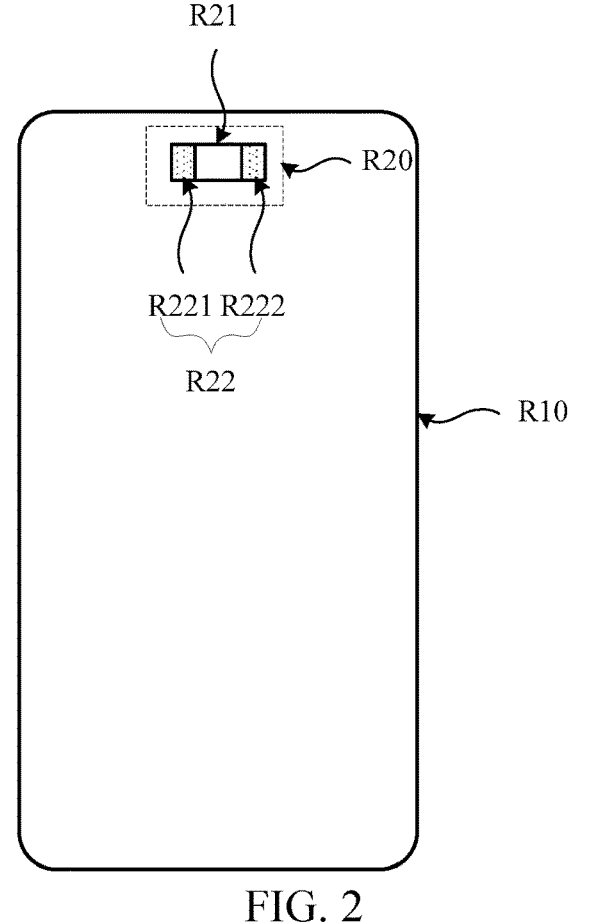
FIG. 2 is a schematic diagram of a planar structure of a display area of a display substrate according to an exemplary embodiment.
Figure 3:
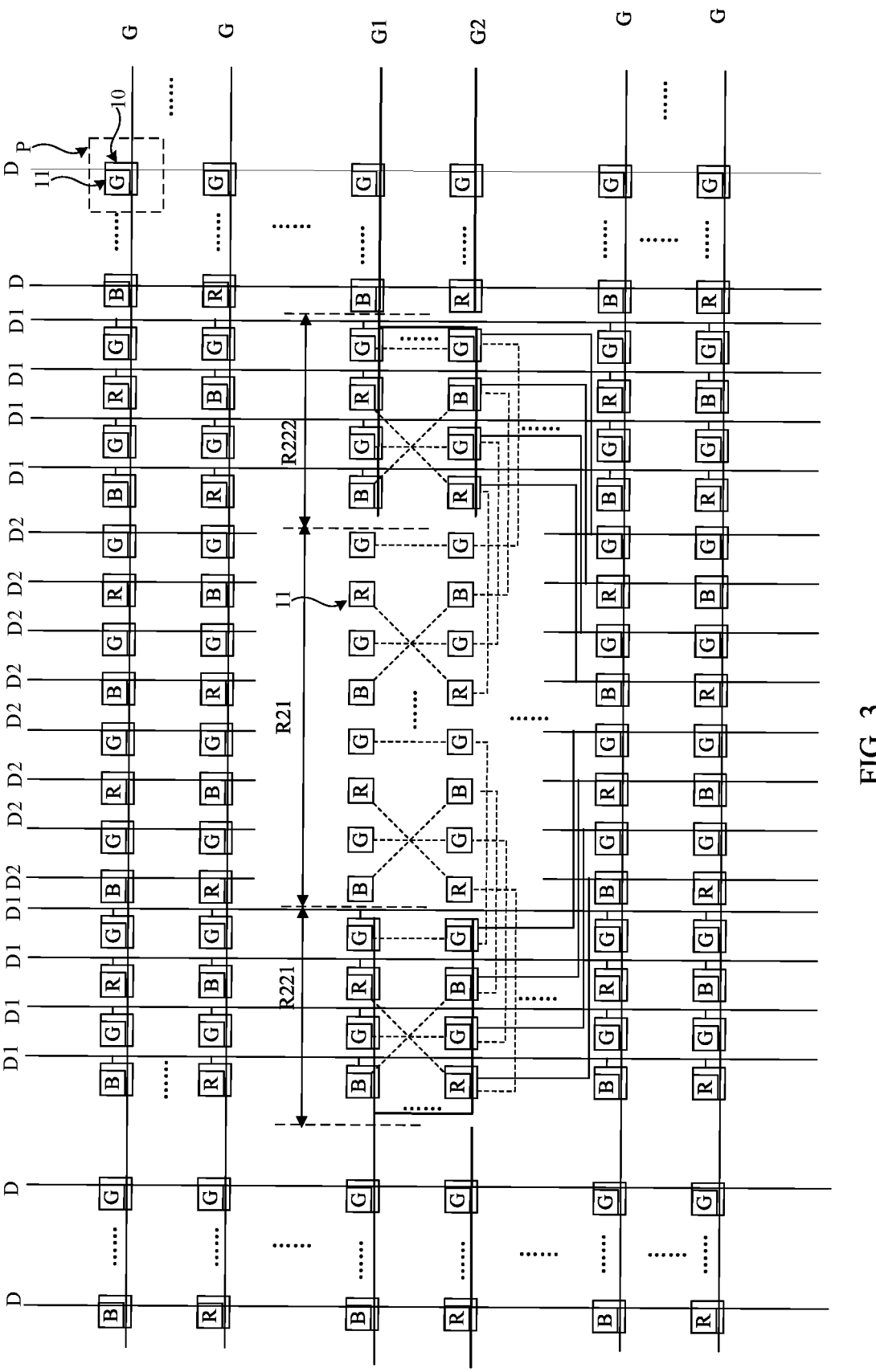
FIG. 3 is a schematic diagram of a structure of a display substrate according to an embodiment of the present disclosure.

FIG. 2 is a schematic diagram of a planar structure of a display area of a display substrate according to an exemplary embodiment. FIG. 3 is a schematic diagram of a structure of a display substrate according to an embodiment of the present disclosure. As shown in FIGS. 2 and 3, the display substrate provided by an embodiment of the present disclosure includes: a display area R10 and a non-display area surrounding the display area. The display area includes a plurality of scan lines G extending along a first direction and a plurality of sub-pixels P arranged in an array. The display area includes a first display area R10 and a second display area R20, the first display area R10 is located at a periphery of the second display area R20, and the second display area R20 includes a light transmitting display area R21 and a transition display area R22 located at a side of the light transmitting display area R21.

As shown in FIG. 3, in an exemplary embodiment, the light transmitting display area includes m rows and n columns of sub-pixels P, and each sub-pixel located in the light transmitting display area includes a light emitting element 11. a light emitting element 11 of each sub-pixel of i-th row located in the light transmitting display area is electrically connected with a light emitting element 11 of a sub-pixel of (i+1)-th row with the same color located in the light transmitting display area, and i is an odd number less than or equal to m. Wherein, each sub-pixel located in the light transmitting display area does not include a pixel circuit.

As shown in FIG. 3, the transition display area includes m rows and n columns of sub-pixels, and the sub-pixels of i-th row of the light transmitting display area and the sub-pixels of i-th row of the transition display area are located in the same row; Each sub-pixel located in the transition display area includes a pixel circuit 10 and a light emitting element 11, and a light emitting element of each sub-pixel of i-th row located in the transition display area is electrically connected with a light emitting element of sub-pixels of (i+1)th row with same color located in the transition display area.

As shown in FIG. 3, the pixel circuits and the light emitting elements of sub-pixels of i-th row located in the transition display area are electrically connected, and a pixel circuit of a sub-pixel of (i+1)-th row and j-th column located in the transition display area is electrically connected with a light emitting element of a sub-pixel of (i+1)-th row and j-th column located in the light transmitting display area, where j is a positive integer less than or equal to n.

As shown in FIG. 3, pixel circuits of sub-pixels of i-th row and (i+1)-th row located in the transition display area are connected with the same scan line.

In an exemplary embodiment, the Pixels Per Inch of the first display area and the second display area are the same. Pixels Per Inch (PPI) refers to the number of pixels per unit area, which can be called a pixel density. The higher the PPI value, the higher a density with which the display substrate can display a picture, and the richer the details of the picture.

In an exemplary embodiment, a position of the light transmitting display area may correspond to a position of an optical device, and have functions of displaying a picture and transmitting light, wherein the transmitted light is received by the optical device. The transition display area has the functions of displaying a picture and providing signals for the light transmitting display area.

In an exemplary embodiment, the values of m and n may be determined according to the dimension of the optical device.

In an exemplary embodiment, in a plane parallel to the display substrate, a shape of the light transmitting display area may be any one or more of following: a rectangle, a polygon, a circle, and an ellipse, and the optical apparatus may be an optical sensor such as a fingerprint recognition apparatus, a camera apparatus, or a 3D imaging apparatus, and the present disclosure is not limited herein. For example, when the shape of the light transmitting display area is a circle, the diameter of the circle may be about 3 mm to 5 mm. As another example, when the shape of the light transmitting display area is a rectangle, the side length of the rectangle may be about 3 mm to 5 mm. FIG. 2 to FIG. 5 are illustrated by taking an example that the shape of the light transmitting display area is a rectangle.

In an exemplary embodiment, in a plane parallel to the display substrate, the shape of the transition display area may be any one or more of the following: rectangle, polygon, circle and ellipse.

In an exemplary embodiment, the shape of a sub pixel may be any one or more of a triangle, a square, a rectangle, a rhombus, a trapezoid, a parallelogram, a pentagon, a hexagon, and other polygons, and sub pixels may be arranged in an X-shape, a cross shape, or a T shape, etc., which are not limited in the present disclosure here.

Figure 4:
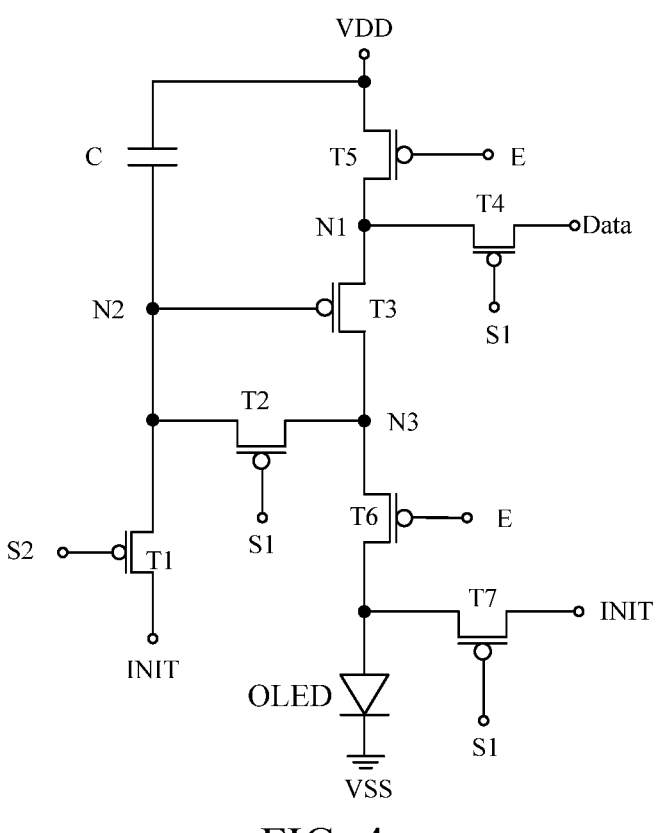
FIG. 4 is a schematic diagram of an equivalent circuit of a pixel circuit.

In an exemplary embodiment, the pixel circuit may be of a 3T1C, 4T1C, 5T1C, 5T2C, 6T1C, or 7T1C structure. FIG. 4 is a schematic diagram of an equivalent circuit of a pixel circuit. As shown in FIG. 4, the pixel circuit may include seven transistors (a first transistor T1 to a seventh transistor T7), one storage capacitor C, and seven signal lines (a data signal line Data, a first scan signal line S1, a second scan signal line S2, a light emitting signal line E, an initial signal line INIT, a first power supply line VDD, and a second power supply line VSS).

In an exemplary embodiment, a first end of the storage capacitor C is connected with the first power supply line VDD, and a second end of the storage capacitor C is connected with the second node N2, namely the second end of the storage capacitor C is connected with a control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with a second electrode of the third transistor T3.

The control electrode of the third transistor T3 is connected with the second node N2, i.e., the control electrode of the third transistor T3 is connected with the second end of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line Data, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line Data to be input to the pixel circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with an on-level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary embodiment, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line in a pixel circuit of a current display row, and the second scan signal line S2 is a scan signal line in a pixel circuit of a previous display row. That is, for an n-th display row, the first scan signal line S1 is S(n), and the second scan signal line S2 is S(n−1). The second scan signal line S2 of the current display row and the first scan signal line S1 in the pixel circuit of the previous display row are a same signal line, thus signal lines of the display substrate may be reduced, so that a narrow bezel of the display substrate is achieved.

In an exemplary embodiment, the first transistor T1 to the seventh transistor T7 may be P-type transistors or N-type transistors. Adopting a same type of transistors in a pixel circuit may simplify a process flow, reduce a process difficulty of a display substrate, and improve a yield of products. In some possible implementations, the first transistor T1 to the seventh transistor T7 may include P-type transistors and N-type transistors.

In an exemplary embodiment, the first scan signal line S1, the second scan signal line S2, the light emitting signal line E, and the initial signal line INIT extend along a horizontal direction, and the second power supply line VSS, the first power supply line VDD, and the data signal line Data extend along a vertical direction.

Figure 5:
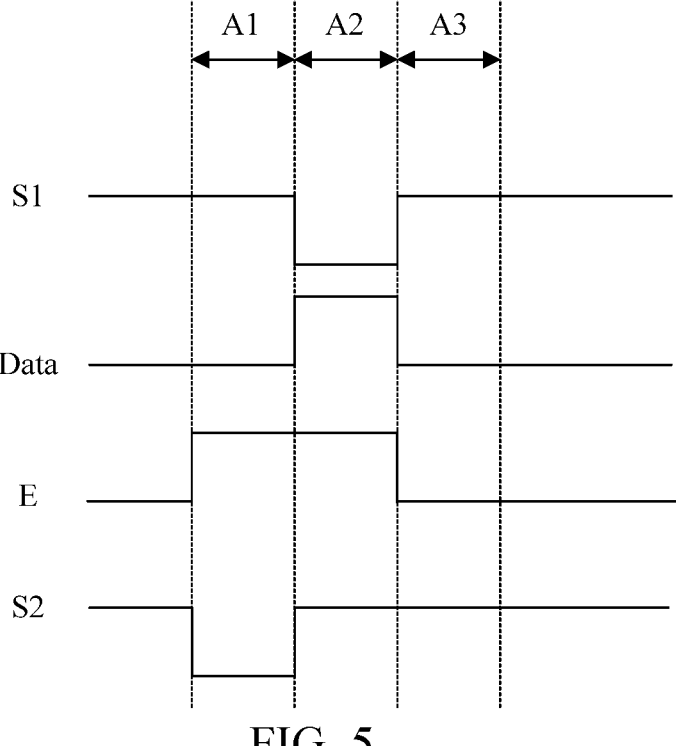
FIG. 5 is a working timing diagram of a pixel circuit.

FIG. 5 is a timing diagram illustrating working of a pixel circuit. An exemplary embodiment of the present disclosure will be described below through a working process of the pixel circuit shown in FIG. 4. The pixel circuit in FIG. 4 includes seven transistors (a first transistor T1 to a seventh transistor T7), one storage capacitor C, and seven signal lines (a data signal line Data, a first scan signal line S1, a second scan signal line S2, a light emitting signal line E, an initial signal line INIT, a first power supply line VDD, and a second power supply line VSS), wherein all of the seven transistors are P-type transistors.

In an exemplary embodiment, a working process of the pixel circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signal, so that the first transistor T1 is turned on, and a signal of the initial signal line INIT is provided to a second node N2 to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line Data outputs a data voltage. In this stage, a second end of the storage capacitor C is at a low level, so the third transistor T3 is turned on. The signal of the first scan signal line S1 is a low-level signal, so that the second transistor T2, the fourth transistor T4, and the seventh transistor T7 are turned on. The second transistor T2 and the fourth transistor T4 are turned on, so that the data voltage output by the data signal line Data is provided to the second node N2 through a first node N1, the turned-on third transistor T3, a third node N3, and the turned-on second transistor T2, and the storage capacitor C is charged with a difference between the data voltage output by the data signal line Data and a threshold voltage of the third transistor T3. A voltage at the second end (the second node N2) of the storage capacitor C is Vd−|Vth|, wherein Vd is the data voltage output by the data signal line Data, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. The signal of the second scan signal line S2 is a high-level signal, so that the first transistor T1 is turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I=K*(Vgs-Vth)^2=K*[(Vdd-Vd+|Vth|)-Vth]^2=K*[(Vdd-Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line Data, and Vdd is the power voltage output by the first power supply line VDD.

The display substrate provided by an embodiment of the present disclosure includes: a display area and a non-display area surrounding the display area. The display area includes a plurality of scan lines extending along a first direction and a plurality of sub-pixels arranged in an array. The display area includes a first display area and a second display area, the first display area is located at a periphery of the second display area, and the second display area includes a light transmitting display area and a transition display area located at a side of the light transmitting display area. The light transmitting display area includes m rows and n columns of sub-pixels, each sub-pixel located in the light transmitting display area includes a light emitting element, wherein a light emitting element of each sub-pixel of i-th row located in the light transmitting display area is electrically connected with a light emitting element of a sub-pixel of (i+1)-th row with the same color located in the light transmitting display area, and i is an odd number less than or equal to m. The transition display area includes m rows and n columns of sub-pixels, and sub-pixels of i-th row of the light transmitting display area and sub-pixels of i-th row of the transition display area are located in the same row;

each sub-pixel located in the transition display area includes a pixel circuit and a light emitting element, wherein a light emitting element of each sub-pixel of i-th row located in the transition display area is electrically connected with a light emitting element of a sub-pixel of (i+1)-th row with the same color located in the transition display area; the pixel circuits and the light emitting elements of the sub-pixels of i-th row located in the transition display area are electrically connected, and a pixel circuit of a sub-pixel of (i+1)-th column and j-th column located in the transition display area is electrically connected with a light emitting element of a sub-pixel of (i+1)-th column and j-th column located in the light transmitting display area, and j is a positive integer less than or equal to n; pixel circuits of sub-pixels of i-th row and (i+1)-th row located in the transition display area are connected with the same scan line. In the present disclosure, since a pixel circuit of a sub-pixel of (i+1)-th row and j-th column located in the transition display area and a light emitting element of a sub-pixel of (i+1)-th row and j-th column located in the light transmitting display area are electrically connected with, the pixel circuits of the sub-pixels of i-th row and (i+1)-th row located in the transition display area are connected with the same scan line, it can be ensured that the light transmitting display area and the transition display area are displayed simultaneously, thus improving the display effect of the display substrate.

Figure 6:
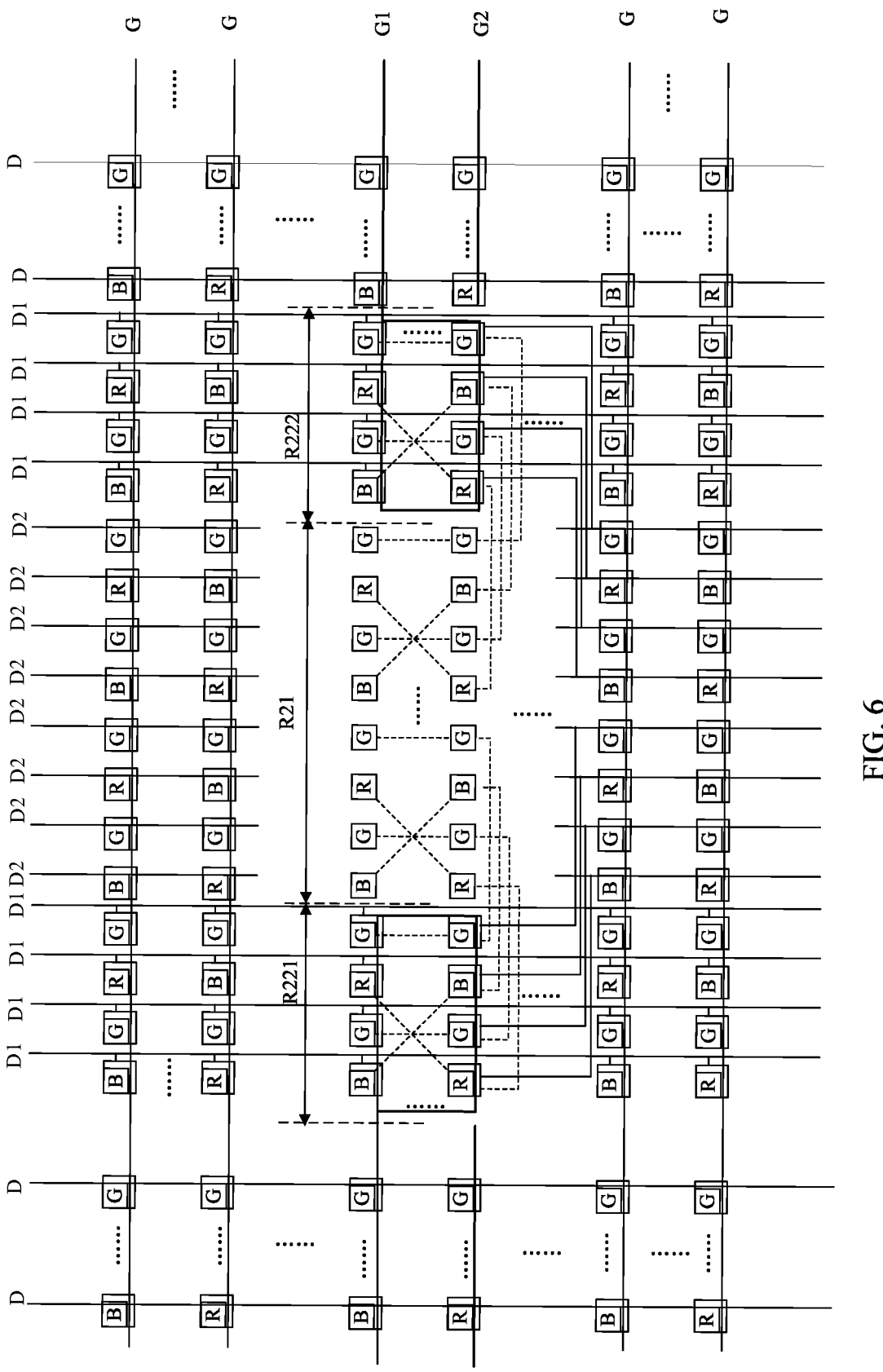
FIG. 6 is a first schematic diagram of a structure of a display substrate according to an exemplary embodiment.
Figure 7:
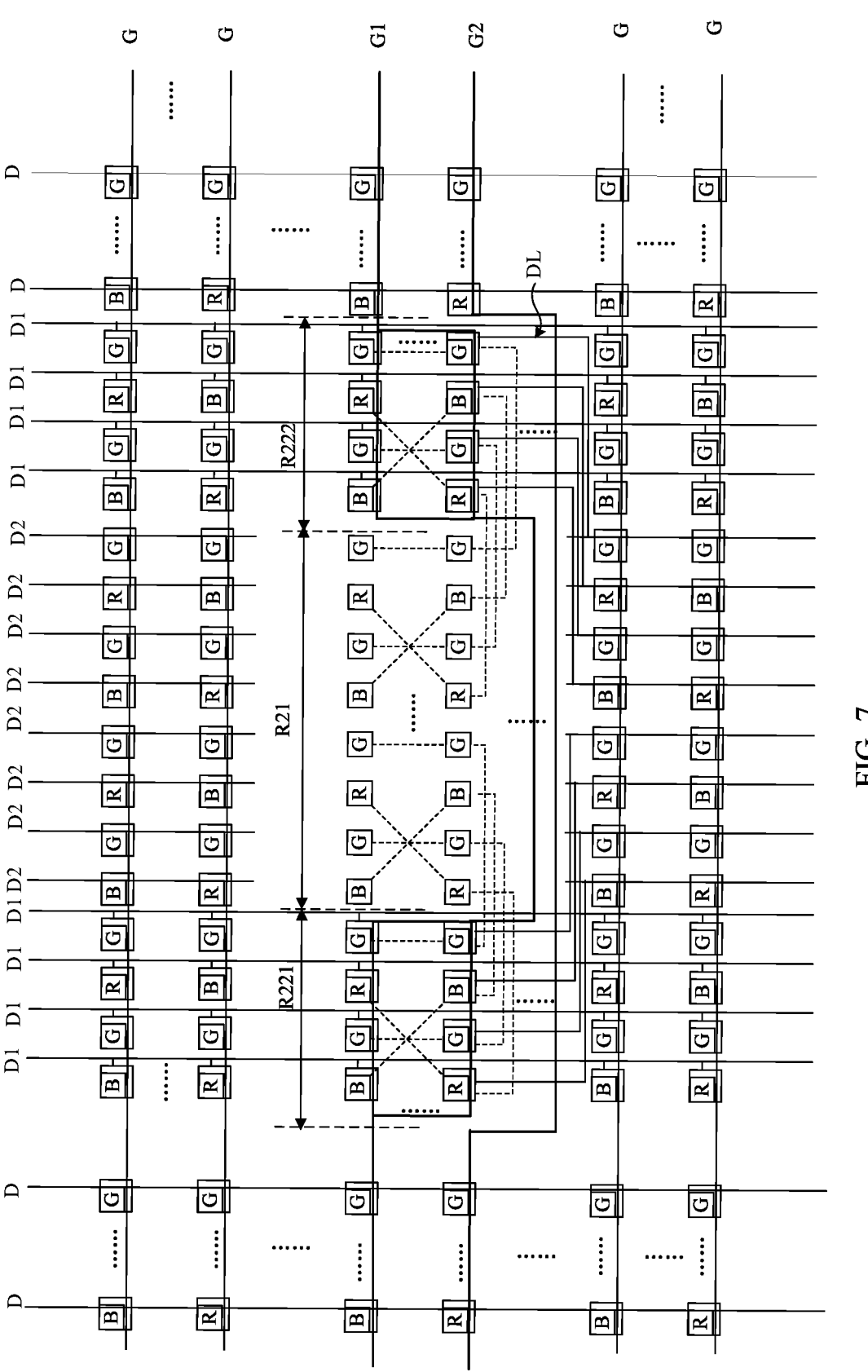
FIG. 7 is a schematic diagram of a structure of a display substrate according to another exemplary embodiment.

In an exemplary embodiment, FIG. 6 is a schematic diagram of a structure of a display substrate according to an exemplary embodiment, and FIG. 7 is a schematic diagram of a structure of a display substrate according to another exemplary embodiment. As shown in FIGS. 3, 6, and 7, the pixel circuits of the sub-pixels of i-th row and (i+1)-th row located in the transition display area are connected with the first scan line G1 or the second scan line G2. The first scan line G1 is a scan line connected with the sub-pixels located in the first display area and in the same row as the sub-pixels of i-th row located in the transition display area; the second scan line G2 is a scan line a scan line connected with a sub-pixel located in the first display area and in the same row as a sub-pixel of (i+1)-th row located in the transition display area. FIGS. 3, 6 and 7 are illustrated by taking an example in which the pixel circuits of the sub-pixels of i-th row and (i+1)-th row located in the transition display area are electrically connected with the first scan line.

As shown in FIGS. 3, 6 and 7, in an exemplary embodiment, the first display area may include a plurality of sub-pixels. Each sub-pixel located in the first display area may include a pixel circuit and a light emitting element.

As shown in FIGS. 3, 6 and 7, in an exemplary embodiment, at least three sub-pixels located in the same row constitute one pixel unit. The light emitting element 11 includes an anode, an organic light emitting layer and a cathode.

In an exemplary embodiment, the organic light emitting layer may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary embodiment, hole injection layers of all sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, emitting layers of adjacent sub-pixels may be overlapped slightly or may be isolated from each other, and electron block layers of adjacent sub-pixels may be overlapped slightly or may be isolated from each other.

In an exemplary embodiment, a pixel unit may include a red sub-pixel, a green sub-pixel, a blue sub-pixel, and a white sub-pixel, which is not limited in the present disclosure. When the pixel unit includes three sub-pixels, the three sub-pixels may be arranged side by side horizontally, side by side vertically, or in a form of delta, and when the pixel unit includes four sub-pixels, the four sub-pixels may be arranged side by side horizontally, side by side vertically, or in a shape of a square, which is not limited in the present disclosure. The present disclosure is illustrated by taking an example in which each pixel unit includes four sub-pixels, and the four sub-pixels are a red sub-pixel, a green sub-pixel, a blue sub-pixel and a green sub-pixel or a blue sub-pixel, a green sub-pixel, a red sub-pixel and a green sub-pixel.

In an exemplary embodiment, the sub-pixels of pixel units located in the same row are arranged in the same manner. The arrangement of sub-pixels in the pixel units in the same column may be the same or different, and the present disclosure is illustrated by taking an example in which the pixel units in the same column are different.

As shown in FIGS. 3, 6 and 7, in an exemplary embodiment, an anode of a light emitting element of each sub-pixel in a pixel unit of i-th row and k-th column located in the light transmitting display area is electrically connected with an anode of a light emitting element of a sub-pixel with the same color in a pixel unit of (i+1)-th row and k-th column located in the light transmitting display area, where k is a positive integer less than or equal to K, K=n/3 or n/4.

In an exemplary embodiment, an anode of a light emitting element of a sub-pixel a pixel unit of i-th row and k-th column located in of the light transmitting display area is electrically connected with an anode of a light emitting element of a nearest sub-pixel with the same color of a pixel unit of (i+1)-th row and k-th column located in the light transmitting display area.

As shown in FIGS. 3, 6, and 7, in an exemplary embodiment, an anode of a light emitting element of each sub-pixel in a pixel unit of i-th row and k-th column located in the transition display area is electrically connected with an anode of a light emitting element of a sub-pixel with the same color in a pixel unit of (i+1)-th row and k-th column located in the transition display area;

In an exemplary embodiment, an anode of a light emitting element of each sub-pixel in a pixel unit of i-th row and k-th column located in the transition display area is electrically connected with an anode of a light emitting element of a nearest sub-pixel with the same color in a pixel unit of (i+1)-th row and k-th column located in the transition display area.

As shown in FIGS. 3, 6, and 7, in an exemplary embodiment, a pixel circuit of a sub-pixel of (i+1)-th row and j-th column located in the transition display area is electrically connected with an anode of a light emitting element of a sub-pixel of (i+1)-th row and j-th column located in the light transmitting display area.

In an exemplary embodiment, a pixel circuit and an anode of a light emitting element of a sub-pixel located in the first display area are electrically connected.

As shown in FIGS. 3, 6 and 7, in an exemplary embodiment, the display substrate further includes a plurality of data lines D extending along a second direction. A pixel circuit of a sub-pixel of i-th row and j-th column located in the transition display area is electrically connected with a first data line D1, a pixel circuit of a sub-pixel of (i+1)-th row and j-th column located in the transition display area is electrically connected with a second data line D2.

In an exemplary embodiment, the first direction intersects the second direction. The first data line D1 is a data line connected with a pixel circuit of a sub-pixel located in the first display area and in the same column as a sub-pixel of i-th row and j-th column located in the transition display area; the second data line D2 is a data line connected with a pixel circuit of a sub-pixel located in the first display area and in the same column as a sub-pixel of (i+1)-th row and j-th column located in the light transmitting display area.

As shown in FIGS. 3, 6 and 7, in an exemplary embodiment, the display substrate may further include a data connection line DL, which is arranged in a different layer from the data line D. The data connection line is electrically connected with a pixel circuit of a sub-pixel of (i+1)-th row and j-th column located in the transition display area and a second data line connected with the pixel circuit of the sub-pixel of (i+1)-th row and j-th column located in the transition display area, respectively.

In an exemplary embodiment, the data connection line DL may be located at a side of the data line D close to the base substrate or may be located at a side of the data line D away from the base substrate.

As shown in FIGS. 2, 3, 6, and 7, in an exemplary embodiment, the light transmitting display area R21 includes a first side and a second side disposed oppositely and a third side and a fourth side disposed oppositely; the transition display area R22 includes a first transition display area R221 and a second transition display area R222.

The first transition display area R221 is located on a first side of the light transmitting display area R21, and the second transition display area R222 is located at a second side of the light transmitting display area R21. The first transition display area R221 and the second transition display area R222 are arranged along the first direction.

In an exemplary embodiment, the number of the second display areas is at least one. FIGS. 2, 3, 6 and 7 are illustrated by taking an example in which the number of the second display areas is one.

Figure 8:
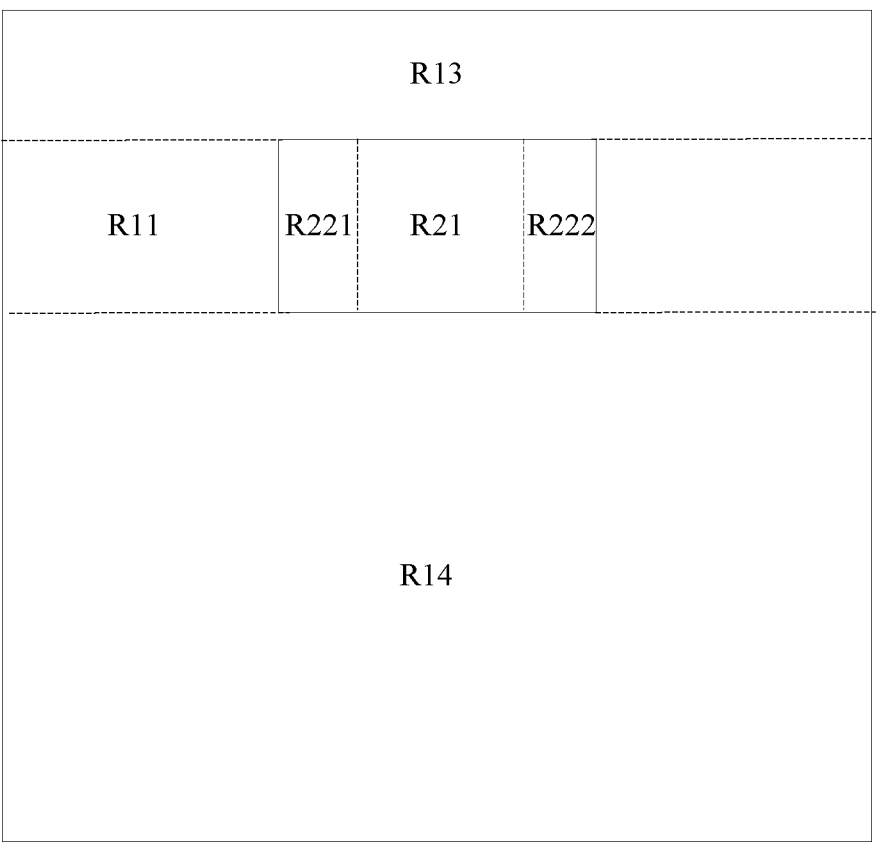
FIG. 8 is a first schematic diagram of a division of a display area.

FIG. 8 is a first schematic diagram of a division of a display area. As shown in FIG. 8, in an exemplary embodiment, when the number of the second display areas is one, the first display area R10 includes a first normal display area R11, a second normal display area R12, a third normal display area R13, and a fourth normal display area R14. A k-th row of the first normal display area R11 is the same row as a k-th row of the light transmitting display area R21, and a k-th row of the second normal display area R12 is the same row as the k-th row of the light transmitting display area R21, where k is a positive integer greater than or equal to 1 and less than or equal to m.

The first normal display area R11 is located at a side of the first transition display area R221 away from the light transmitting display area R21, and the second normal display area R12 is located at a side of the second transition display area R222 away from the light transmitting display area R21; the third normal display area R13 is located at a third side of the light transmitting display area R21, and the fourth normal display area R14 is located at a fourth side of the light transmitting display area R21; the third normal display area R13 and the fourth normal display area R14 are arranged along the second direction.

Figure 9:
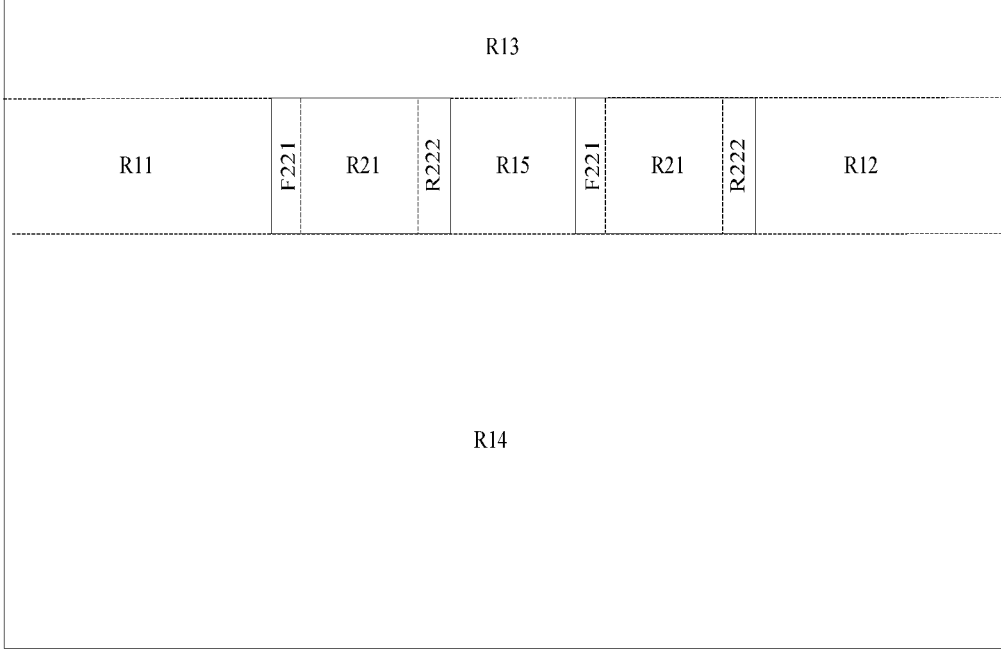
FIG. 9 is a second schematic diagram of a division of a display area.

FIG. 9 is a second schematic diagram of a division of a display area. As shown in FIG. 9, in an exemplary embodiment, when the number of the second display areas is at least two, the first display area include: a first normal display area R11, a second normal display area R12, a third normal display area R13, a fourth normal display area R14, and Q−1 fifth normal display areas R15. A k-th row of the first normal display area R11 is the same row as a k-th row of the light transmitting display area R21, a k-th row of the second normal display area R12 is the same row as the k-th row of the light transmitting display area R21, and a k-th row of the fifth normal display area R15 is the same row as the k-th row of the light transmitting display area R21, where k is a positive integer greater than or equal to 1 and less than or equal to m, and Q is the number of the second display areas.

The first normal display area R11 is located at a side of the first transition display area R221 away from the light transmitting display area R21, and the second normal display area R12 is located at a side of the second transition display area R222 away from the light transmitting display area R21; the third normal display area R13 is located at a third side of the light transmitting display area R21, and the fourth normal display area R14 is located at a fourth side of the light transmitting display area R21; the third normal display area R13 and the fourth normal display area R14 are arranged along the second direction; an i-th fifth normal display area R15 is located between an i-th second display area and an (i+1)-th second display area. FIG. 9 is described by taking Q=2 as an example.

In an exemplary embodiment, as shown in FIGS. 3, 6 and 7, the first data line D1 may be electrically connected with a pixel circuit of a sub-pixel of i-th row and j-th column located in the light transmitting display area and a pixel circuit of a sub-pixel of i-th row and j-th column located in the third normal display area and the fourth normal display area, which is located in the same column as the pixel circuit of the sub-pixel of i-th row and j-th column located in the light transmitting display area.

In an exemplary embodiment, as shown in FIGS. 3, 6 and 7, the second data line D2 may include a first sub-data line and a second sub-data line arranged at intervals and extending in the second direction, the first and second sub-data lines are arranged along the second direction. The first sub-data line is electrically connected with a pixel circuit of a sub-pixel located in the third normal display area and located in the same column as a sub-pixel of (i+1)-th row and j-th column located in the light transmitting display area. The second sub-data line is electrically connected with a pixel circuit of a sub-pixel located in the fourth normal display area and located in the same column as a sub-pixel of (i+1)-th row and j-th column located in the light transmitting display area.

Figure 10:
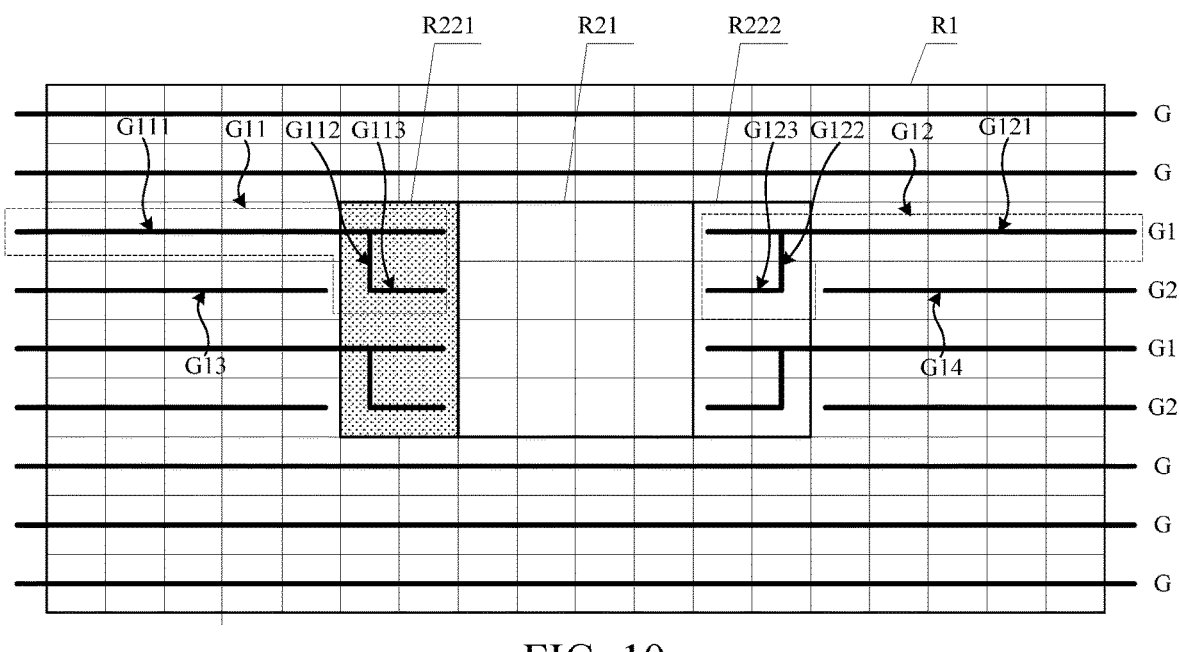
FIG. 10 is a first schematic diagram of a plurality of scan lines according to an exemplary embodiment.
Figure 11:
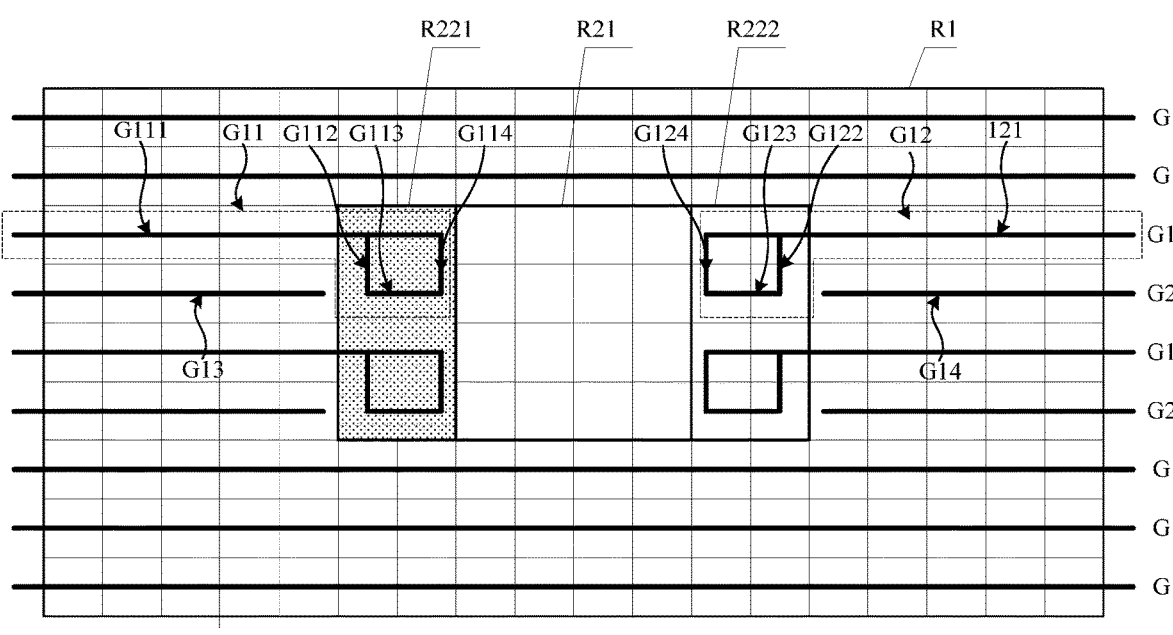
FIG. 11 is a second schematic diagram of a plurality of scan lines according to an exemplary embodiment.

FIG. 10 is a first schematic diagram of a plurality of scan lines according to an exemplary embodiment, FIG. 11 is a second schematic diagram of a plurality of scan lines according to an exemplary embodiment. As shown in FIGS. 10 and 11, when the number of the second display areas is one and the pixel circuits of the sub-pixels of i-th row and (i+1)-th row located in the transition display area are connected with the first scan line, the first scan line G1 includes a first scan portion G11 and a second scan portion G12 arranged at intervals. The second scan line G2 includes a third scan portion G13 and a fourth scan portion G14 arranged at intervals and extending along the first direction. The first scan portion G11 is electrically connected with the pixel circuits of the sub-pixels of i-th row located in the first transition display area R221, the pixel circuits of the sub-pixels of (i+1)-th row located in the first transition display area R221, and the pixel circuits of the sub-pixels of i-th row located in the first normal display area, respectively. The second scan portion G12 is electrically connected with the pixel circuits of the sub-pixels of i-th row and (i+1)-th row located in the second transition display area R222 and the pixel circuits of the sub-pixels of i-th row located in the second normal display area, respectively. The third scan portion G13 is electrically connected with the pixel circuits of the sub-pixels of (i+1)-th row located in the first normal display area. The fourth scan portion G14 is electrically connected with the pixel circuits of the sub-pixels of (i+1)-th row located in the second normal display area.

In an exemplary embodiment, as shown in FIGS. 10 and 11, the first scan portion may include a first connection portion G111, a second connection portion G112, and a third connection portion G113. The first connection portion G111 and the third connection portion G113 extend along the first direction, and the second connection portion G112 extends along the second direction. The first connection portion G111 is electrically connected with the pixel circuits of the sub-pixels of i-th row located in the first normal display area, the pixel circuits of the sub-pixels of i-th row located in the first transition display area R221 and the second connection portion G112, respectively. The second connection portion G112 is electrically connected with the third connection portion G113. The third connection portion G113 is electrically connected with the pixel circuits of the sub-pixels of (i+1)-th row located in the first transition display area 8221. The first scan portion in FIG. 10 is an open loop.

In an exemplary embodiment, as shown in FIGS. 10 and 11, the second scan portion G12 includes a fourth connection portion G121, a fifth connection portion G122, and a sixth connection portion G123, wherein the fourth connection portion G121 and the sixth connection portion G123 extends along the first direction, and the fifth connection portion G122 extends along the second direction. The fourth connection portion G121 is electrically connected with the pixel circuits of the sub-pixels of i-th row located in the second normal display area, the pixel circuits of the sub-pixels of i-th row located in the second transition display area 8222, and the fifth connection portion G122, respectively. The fifth connection portion G122 is electrically connected with the sixth connection portion G123. The sixth connection portion G123 is electrically connected with the pixel circuits of the sub-pixels of (i+1)-th row located in the second transition display area 8222. The second scan portion in FIG. 10 is an open loop.

In an exemplary embodiment, as shown in FIG. 11, the first scan portion G11 may further include a seventh connection portion G114. The seventh connection portion G114 extends along the second direction. The seventh connection portion G114 is electrically connected with the first connection portion G111 and the third connection portion G113, respectively. The first scan portion in FIG. 11 includes a closed loop, and the first scan portion located in the transition display area is a closed loop.

In an exemplary embodiment, the first scan portion located in the transition display area being a closed loop can reduce the load of the first scan line.

In an exemplary embodiment, as shown in FIG. 11, the second scan portion G12 may further include an eighth connection portion G124. The eighth connection portion G124 extends along the second direction. The eighth connection portion G124 is electrically connected with the fourth connection portion G121 and the sixth connection portion G123. The second scan portion in FIG. 11 includes a closed loop, and the second scan portion located in the transition display area is a closed loop.

In an exemplary embodiment, the second scan portion located in the transition display area being a closed loop can reduce the load of the first scan line.

Figure 12:
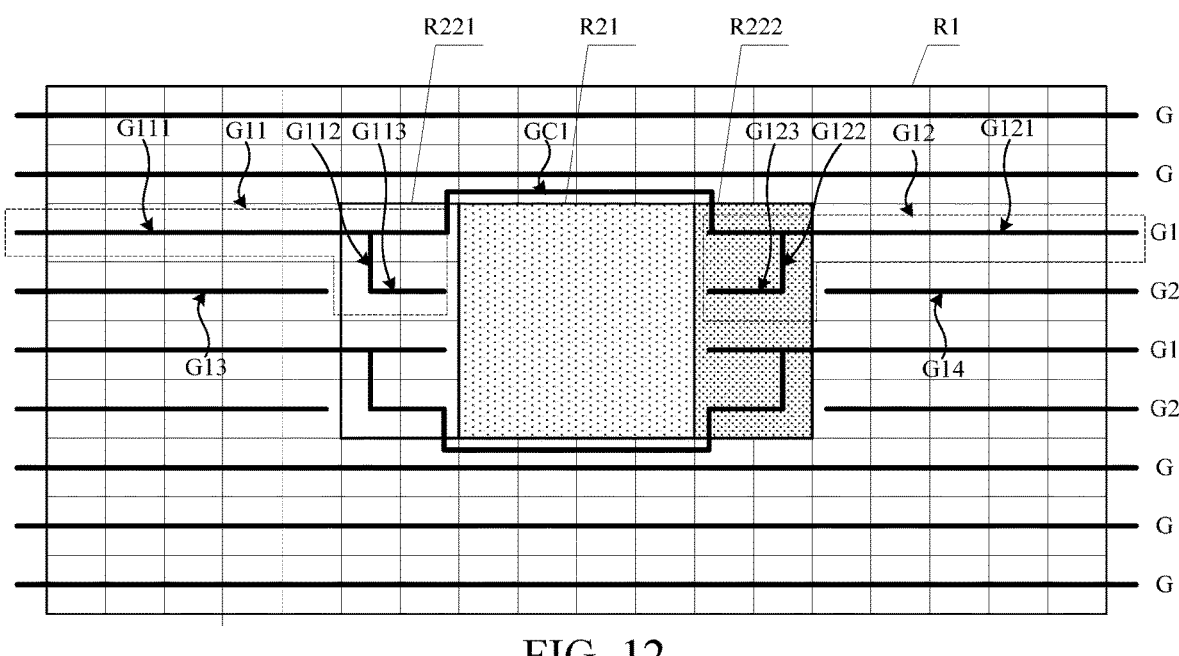
FIG. 12 is a third schematic diagram of a plurality of scan lines according to an exemplary embodiment.
Figure 13:
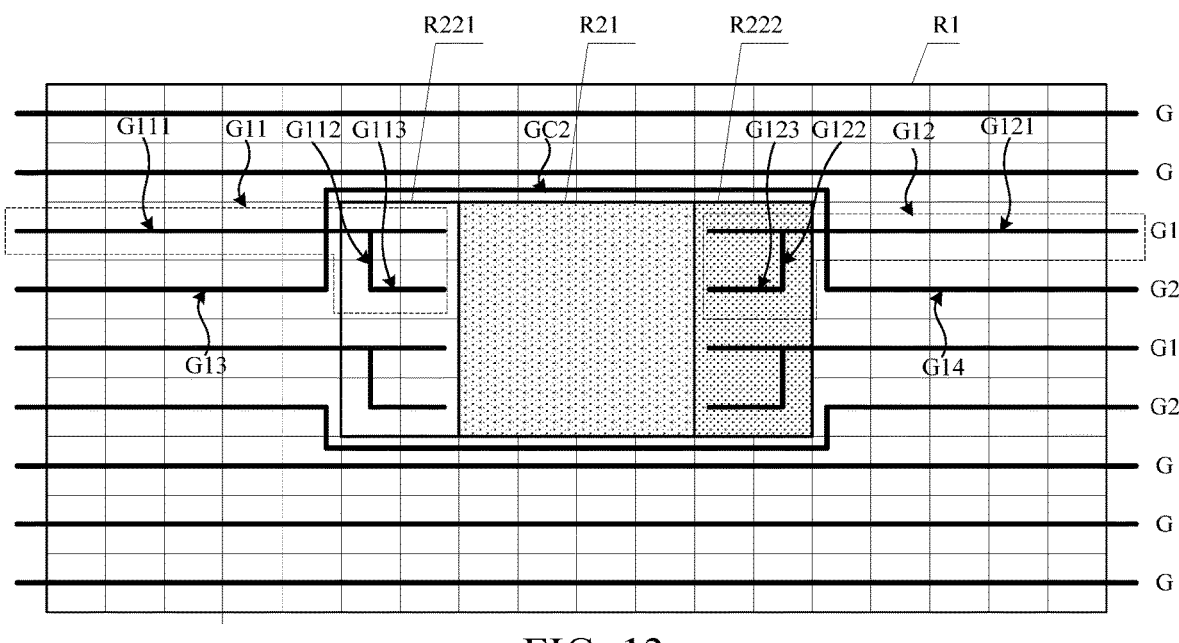
FIG. 13 is a fourth schematic diagram of a plurality of scan lines according to an exemplary embodiment.
Figure 14:
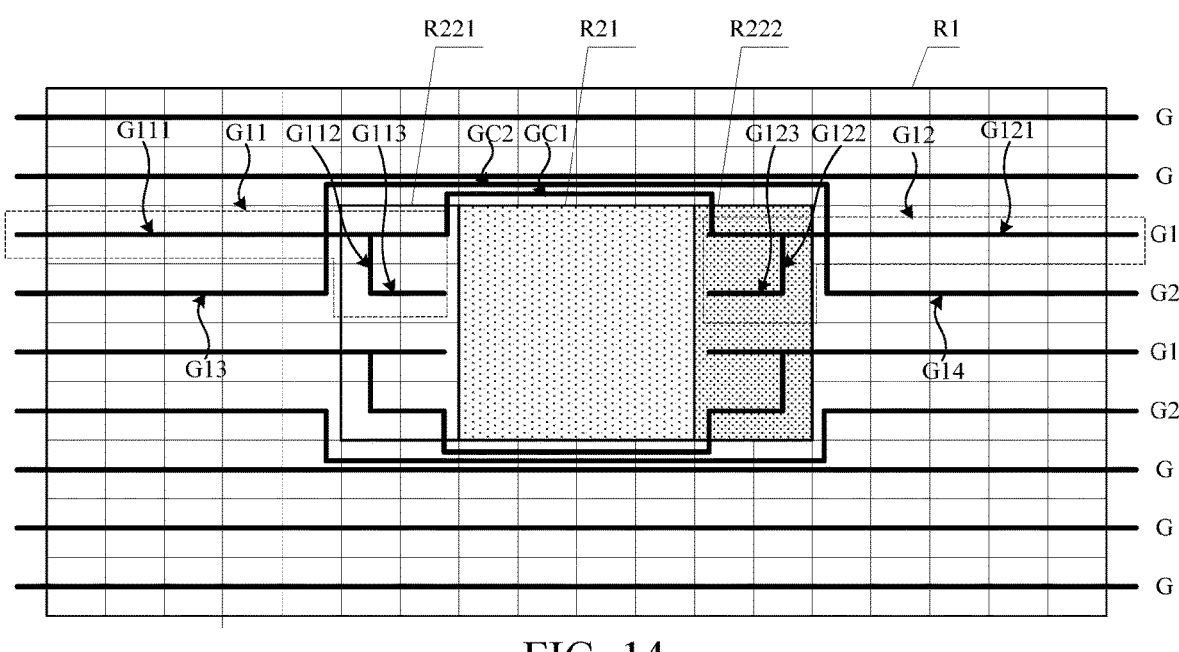
FIG. 14 is a fifth schematic diagram of a plurality of scan lines according to an exemplary embodiment.
Figure 15:
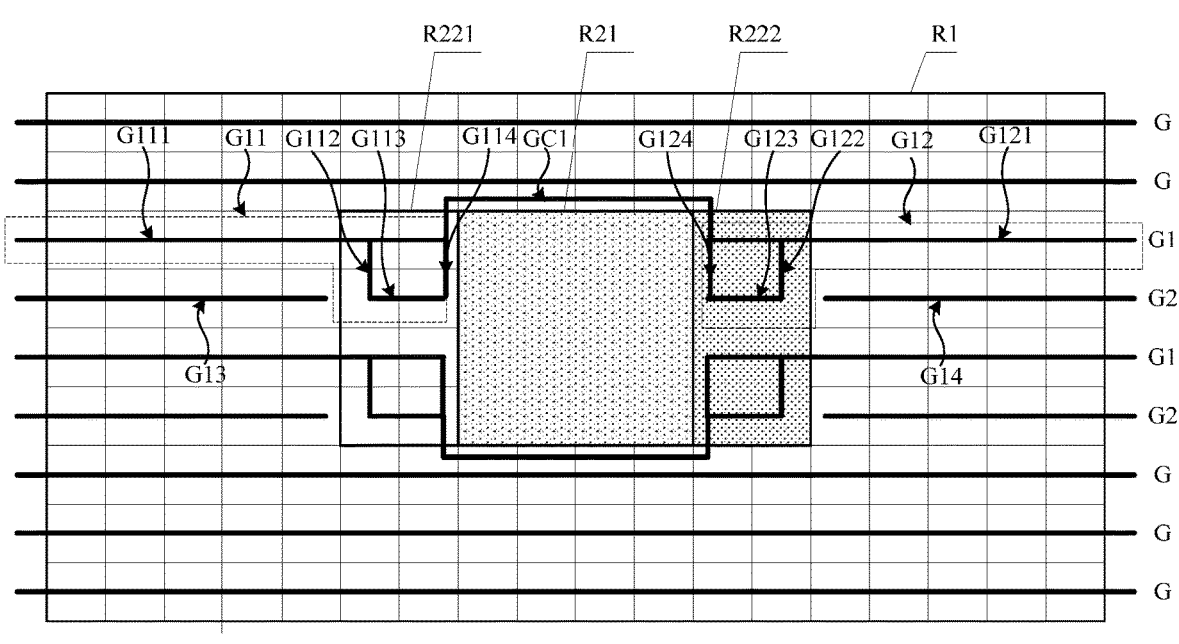
FIG. 15 is a sixth schematic diagram of a plurality of scan lines according to an exemplary embodiment.
Figure 16:
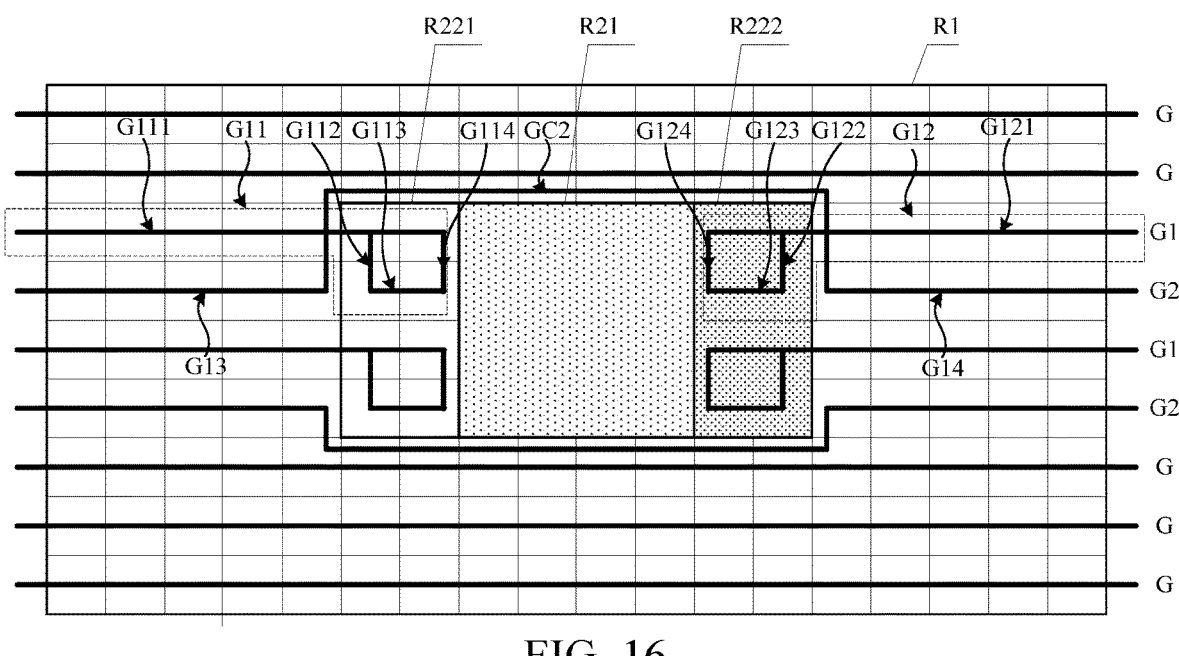
FIG. 16 is a seventh schematic diagram of a plurality of scan lines according to an exemplary embodiment.
Figure 17:
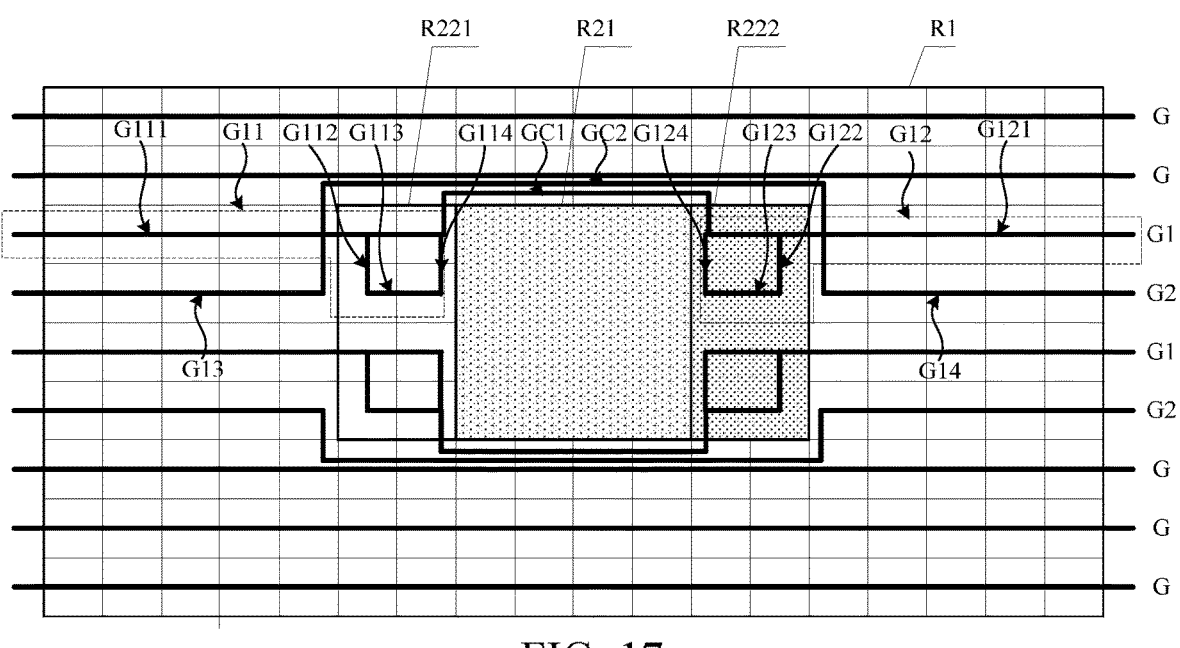
FIG. 17 is an eighth schematic diagram of a plurality of scan lines according to an exemplary embodiment.

FIG. 12 is a third schematic diagram of a plurality of scan lines according to an exemplary embodiment. FIG. 13 is a fourth schematic diagram of a plurality of scan lines according to an exemplary embodiment. FIG. 14 is a fifth schematic diagram of a plurality of scan lines according to an exemplary embodiment. FIG. 15 is a sixth schematic diagram of a plurality of scan lines according to an exemplary embodiment. FIG. 16 is a seventh schematic diagram of a plurality of scan lines according to an exemplary embodiment. FIG. 17 is an eighth schematic diagram of a plurality of scan lines according to an exemplary embodiment. As shown in FIGS. 12 to 17, the first scan line G1 may further include a first scan connection portion GC1, or the second scan line G2 may further include a second scan connection portion GC2.

The first scan connection portion GC1 is electrically connected to the first scan portion G11 and the second scan portion G12, respectively; the second scan connection portion GC2 is electrically connected to the third scan portion G13 and the fourth scan portion G14, respectively. FIG. 12 is illustrated by taking an example in which the first scan portion and the second scan portion are open-loops, and the first scan line includes the first scan connection portion GC1. FIG. 13 is illustrated by taking an example in which the first scan portion and the second scan portion are open-loops, and the second scan line includes the second scan connection portion GC2. FIG. 14 is illustrated by taking an example in which the first scan portion and the second scan portion are open-loops, and the first scan line includes the first scan connection portion GC1, and the second scan line includes the second scan connection portion GC2. FIG. 15 is illustrated by taking an example in which the first scan portion and the second scan portion include a closed loop and the first scan line includes the first scan connection portion GC1. FIG. 16 is illustrated by taking an example in which the first scan portion and the second scan portion include a closed loop and the second scan line includes the second scan connection portion GC2. FIG. 17 is illustrated by taking an example in which the first scan portion and the second scan portion include a closed loop, and the first scan line includes the first scan connection portion GC1, and the second scan line includes the second scan connection portion GC2.

Figure 18:
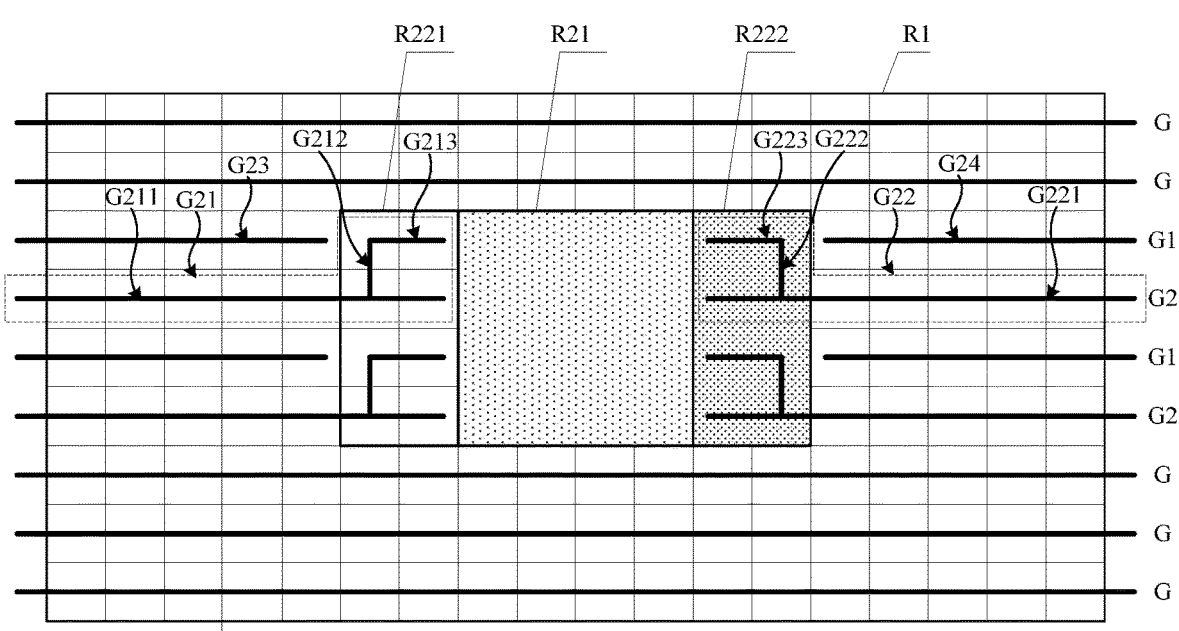
FIG. 18 is a first schematic diagram of a plurality of scan lines according to another exemplary embodiment.
Figure 19:
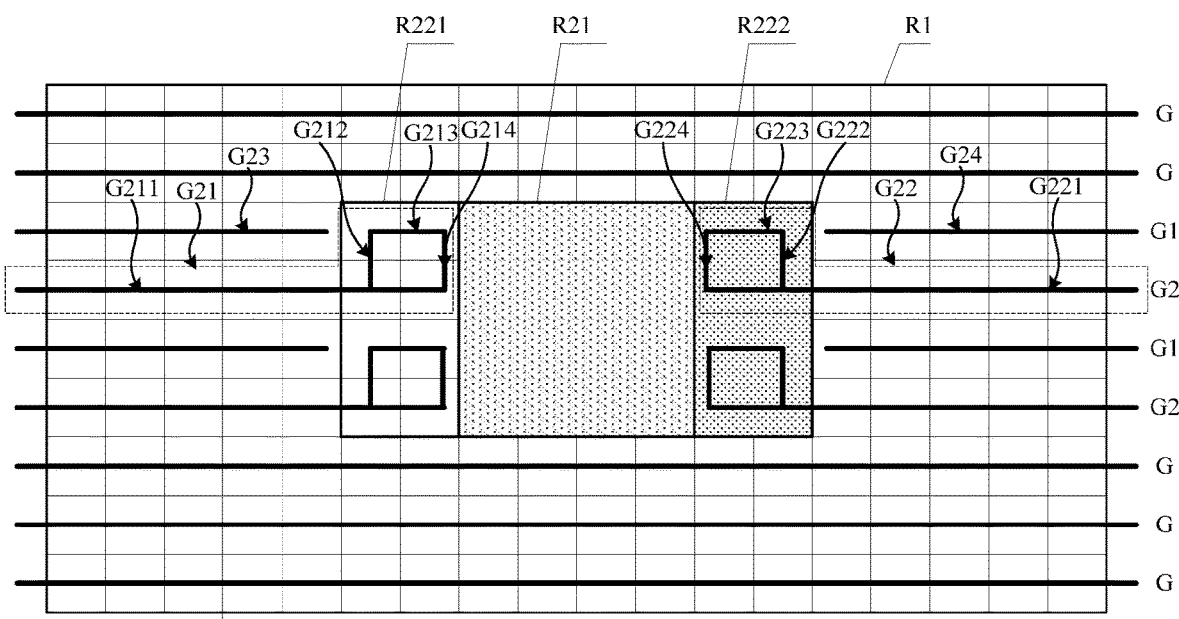
FIG. 19 is a second schematic diagram of a plurality of scan lines according to another exemplary embodiment.

FIG. 18 is a first schematic diagram of a plurality of scan lines according to another exemplary embodiment, FIG. 19 is a second schematic diagram of a plurality of scan lines according to another exemplary embodiment. As shown in FIGS. 18 and 19, when the number of the second display areas is one and the pixel circuits of the sub-pixels of i-th row and (i+1)-th row located in the transition display area are connected with the second scan line, the second scan line G2 includes a first scan portion G21 and a second scan portion G22 arranged at intervals. The first scan line G1 includes a third scan portion G23 and a fourth scan portion G24 arranged at intervals and extending along the first direction.

In an exemplary embodiment, the first scan portion G21 may be electrically connected with pixel circuits of the sub-pixels of i-th row and (i+1)-th row located in the first transition display area R221 and pixel circuits of the sub-pixels of (i+1)-th row located in the first normal display area, respectively.

In an exemplary embodiment, the second scan portion G22 may be electrically connected with the pixel circuits of the sub-pixels of i-th row and (i+1)-th row located in the second transition display area R222 and the pixel circuits of the sub-pixels of (i+1)-th row located in the second normal display area, respectively.

In an exemplary embodiment, the third scan portion G23 may be electrically connected with the pixel circuits of the sub-pixels of i-th row located in the first normal display area.

In an exemplary embodiment, the fourth scan portion G24 may be electrically connected with the pixel circuits of the sub-pixels of i-th row located in the second normal display area.

In an exemplary embodiment, as shown in FIGS. 18 and 19, the first scan portion G21 may include a first connection portion G211, a second connection portion G212, and a third connection portion G213. The first connection portion G211 and the third connection portion G213 extend along the first direction, and the second connection portion G212 extends along the second direction. In an exemplary embodiment, the first connection portion G211 may be electrically connected with the pixel circuits of the sub-pixels of i-th row located in the first normal display area, the pixel circuits of the sub-pixels of i-th row located in the first transition display area R221, and the second connection portion G212, respectively. The second connection portion G212 may be electrically connected with the third connection portion G213. The third connection portion G213 may be electrically connected with the pixel circuit of the sub-pixels of i-th row located in the first transition display area R221. The first scan portion in FIG. 18 is an open loop.

In an exemplary embodiment, as shown in FIGS. 18 and 19, the second scan portion G22 may include a fourth connection portion G221, a fifth connection portion G222, and a sixth connection portion G223. The fourth connection portion G221 and the sixth connection portion G223 extend along the first direction, and the fifth connection portion G222 extends along the second direction. In an exemplary embodiment, the fourth connection portion G221 is electrically connected with the pixel circuits of the sub-pixels of (i+1)-th row located in the second normal display area, the pixel circuits of the sub-pixels of (i+1)-th row located in the second transition display area R222, and the fifth connection portion, respectively; the fifth connection portion G222 is electrically connected with the sixth connection portion G223; the sixth connection portion G223 is electrically connected with the pixel circuits of the sub-pixels of i-th row located in the second transition display area R222. The second scan portion in FIG. 18 is an open loop.

In an exemplary embodiment, as shown in FIG. 19, the first scan portion G21 may further include a seventh connection portion G214 extending along the second direction. The seventh connection portion G214 is electrically connected with the first connection portion G211 and the third connection portion G213, respectively. The first scan portion in FIG. 19 includes a closed loop, and the first scan portion located in the transition display area is a closed loop.

In an exemplary embodiment, the first scan portion located in the transition display area being a closed loop can reduce the load of the first scan line.

In an exemplary embodiment, as shown in FIG. 19, the second scan portion G22 may further include an eighth connection portion G224 extending along the second direction. The eighth connection portion G224 is electrically connected with the fourth connection portion G221 and the sixth connection portion G223, respectively. The second scan portion in FIG. 19 includes a closed loop, and the second scan portion located in the transition display area is a closed loop.

In an exemplary embodiment, the second scan portion located in the transition display area being a closed loop can reduce the load of the first scan line.

Figure 20:
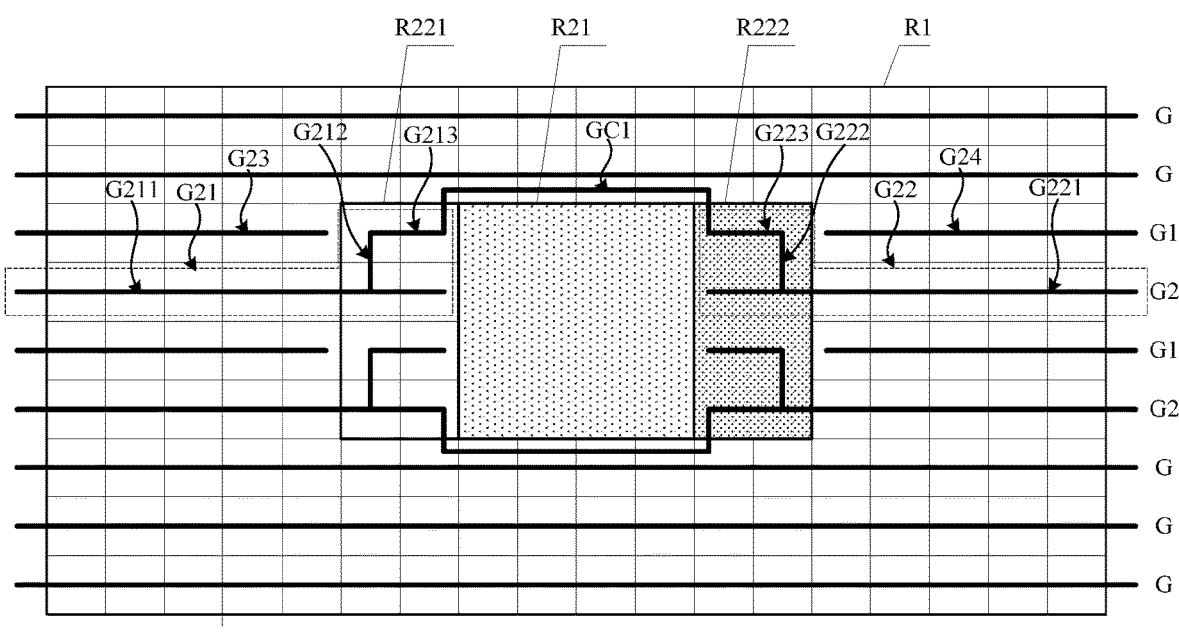
FIG. 20 is a third schematic diagram of a plurality of scan lines according to another exemplary embodiment.
Figure 21:
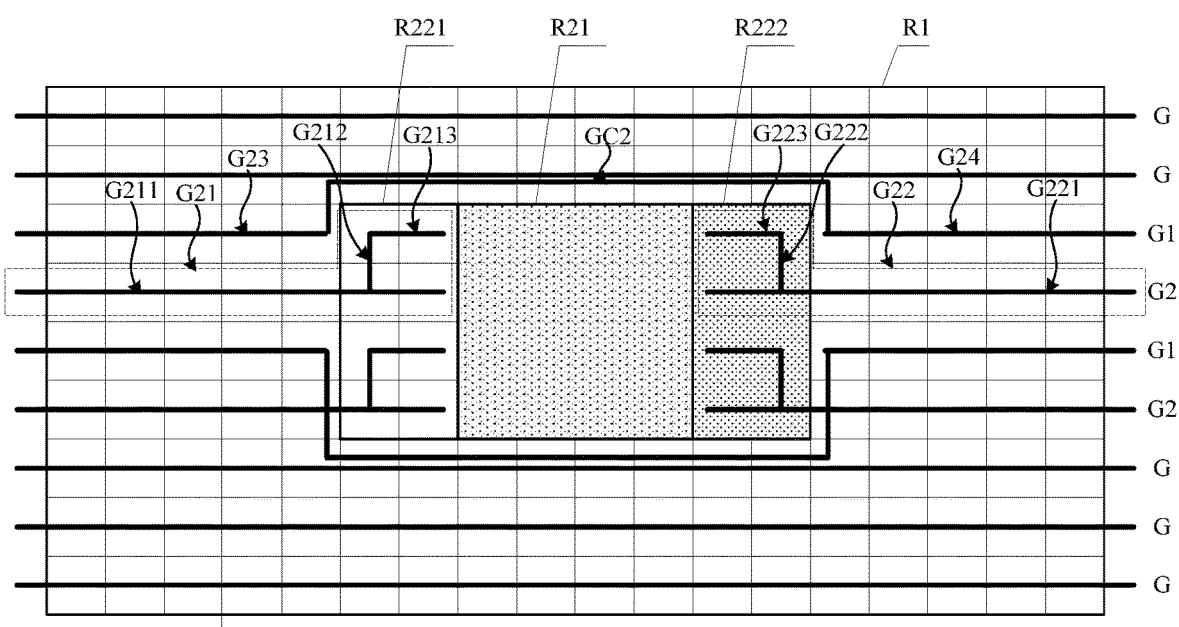
FIG. 21 is a fourth schematic diagram of a plurality of scan lines according to another exemplary embodiment.
Figure 22:
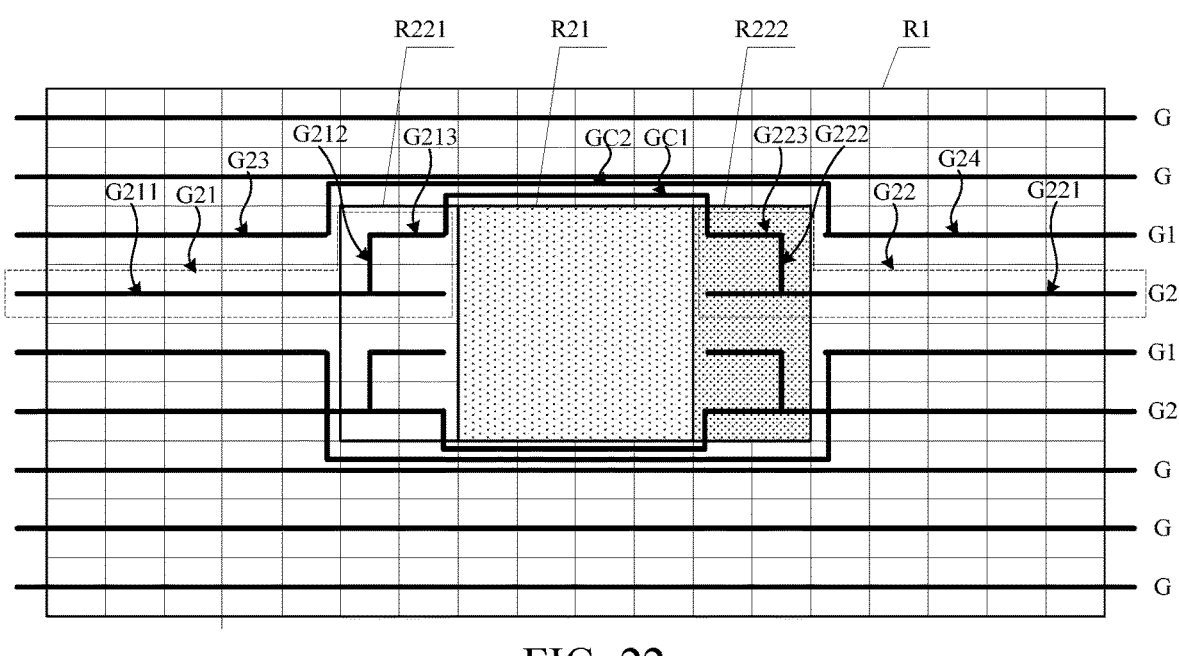
FIG. 22 is a fifth schematic diagram of a plurality of scan lines according to another exemplary embodiment.
Figure 23:
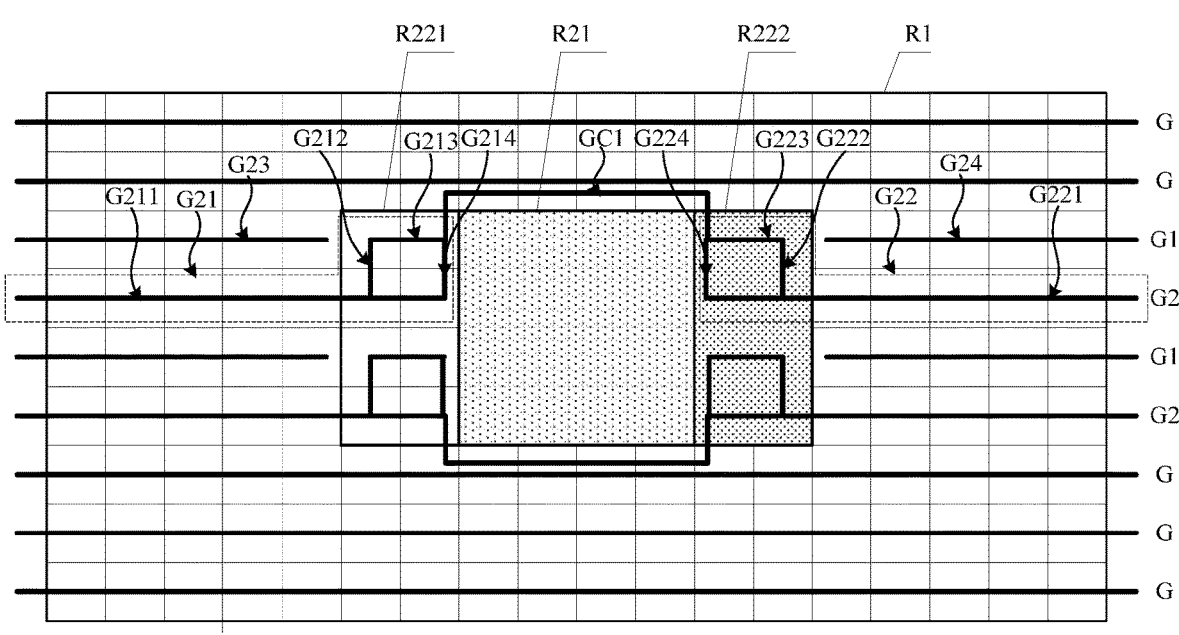
FIG. 23 is a sixth schematic diagram of a plurality of scan lines according to another exemplary embodiment.
Figure 24:
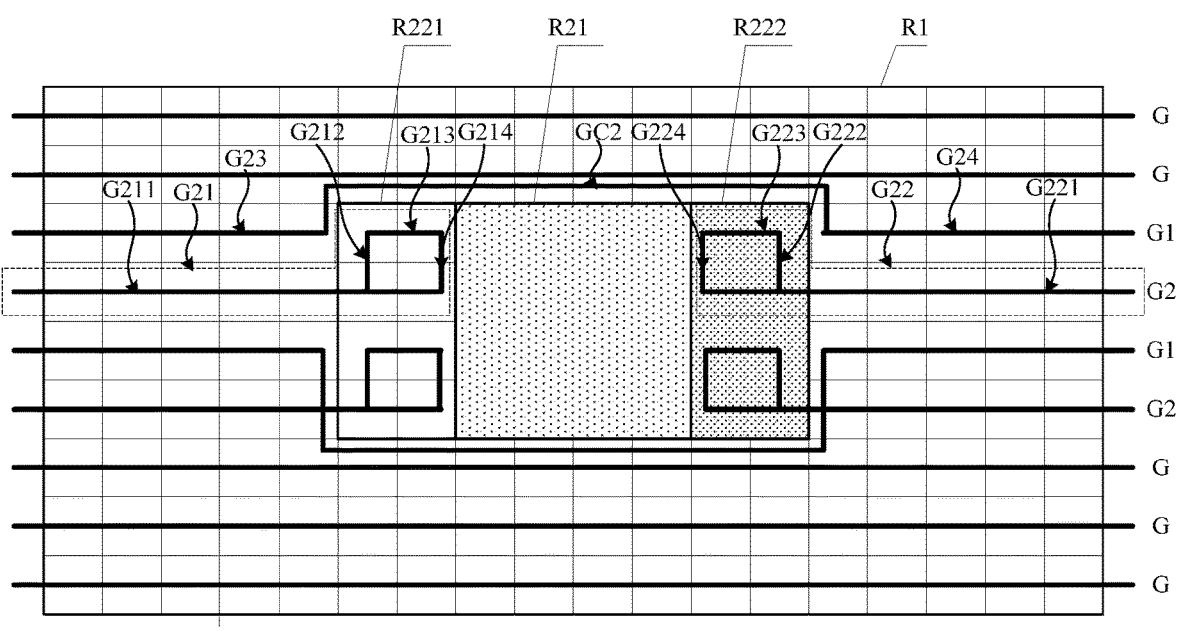
FIG. 24 is a seventh schematic diagram of a plurality of scan lines according to another exemplary embodiment.
Figure 25:
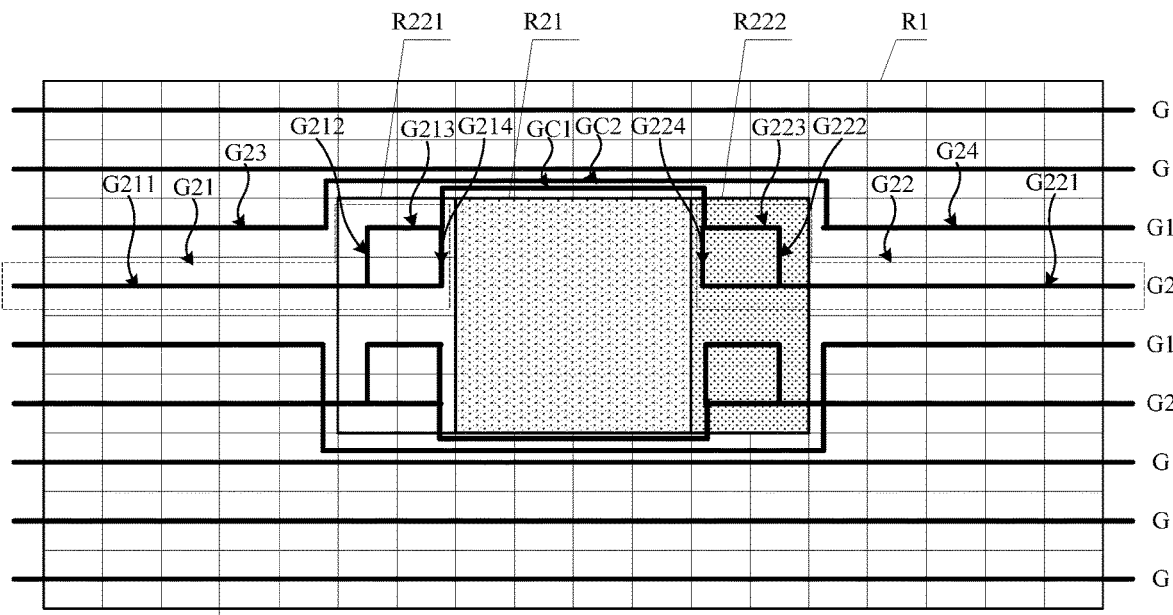
FIG. 25 is an eighth schematic diagram of a plurality of scan lines according to another exemplary embodiment.

FIG. 20 is a third schematic diagram of a plurality of scan lines according to another exemplary embodiment. FIG. 21 is a fourth schematic diagram of a plurality of scan lines according to another exemplary embodiment. FIG. 22 is a fifth schematic diagram of a plurality of scan lines according to another exemplary embodiment. FIG. 23 is a sixth schematic diagram of a plurality of scan lines according to another exemplary embodiment. FIG. 24 is a seventh schematic diagram of a plurality of scan lines according to another exemplary embodiment. FIG. 25 is an eighth schematic diagram of a plurality of scan lines according to another exemplary embodiment. As shown in FIGS. 20 to 25, the first scan line G1 may further include a first scan connection portion GC1, or the second scan line G2 may further include a second scan line G2.

In an exemplary embodiment, the first scan connection portion GC1 is electrically connected to the first scan portion G11 and the second scan portion G12, respectively; the second scan connection portion GC2 is electrically connected to the third scan portion G13 and the fourth scan portion G14, respectively. FIG. 20 is illustrated by taking an example in which the first scan portion and the second scan portion are open-loops, and the first scan line includes the first scan connection portion GC1. FIG. 21 is illustrated by taking an example in which the first scan portion and the second scan portion are open-loops, and the second scan line includes the second scan connection portion GC2. FIG. 22 is illustrated by taking an example in which the first scan portion and the second scan portion are open-loops, and the first scan line includes the first scan connection portion GC1, and the second scan line includes the second scan connection portion GC2. FIG. 23 is illustrated by taking an example in which the first scan portion and the second scan portion include a closed loop and the first scan line includes the first scan connection portion GC1. FIG. 24 is illustrated by taking an example in which the first scan portion and the second scan portion include a closed loop and the second scan line includes the second scan connection portion GC2. FIG. 25 is illustrated by taking an example in which the first scan portion and the second scan portion include a closed loop, and the first scan line includes the first scan connection portion GC1, and the second scan line includes the second scan connection portion GC2.

In an exemplary embodiment, the driving mode of the scan lines may be determined according to the load of the scan lines and the space of the display substrate.

In an exemplary embodiment, as shown in FIGS. 10, 11, 18, 19, the first scan line G1 is driven bilaterally, the second scan line may be driven bilaterally, and the scan lines G other than the first scan line and the second scan line may be driven bilaterally or may be driven unilaterally.

In an exemplary embodiment, as shown in FIGS. 12, 15, 21 and 24, the first scan line G1 may be driven unilaterally or bilaterally, the second scan line may be driven bilaterally, and the scan lines G other than the first scan line and the second scan line may be driven bilaterally or may be driven unilaterally.

In an exemplary embodiment, as shown in FIGS. 13, 16, 20 and 23, the first scan line G1 may be driven bilaterally, the second scan line may be driven unilaterally or bilaterally, and the scan lines G other than the first scan line and the second scan line may be driven bilaterally or may be driven unilaterally.

In an exemplary embodiment, as shown in FIGS. 14 17 22 and 25, all scan lines may be driven bilaterally or may be driven unilaterally.

In an exemplary embodiment, the scan line driven bilaterally can reduce the load of the scan lines. A narrow bezel of the display substrate can be realized by adopting the scan lines driven unilaterally.

Figure 26:
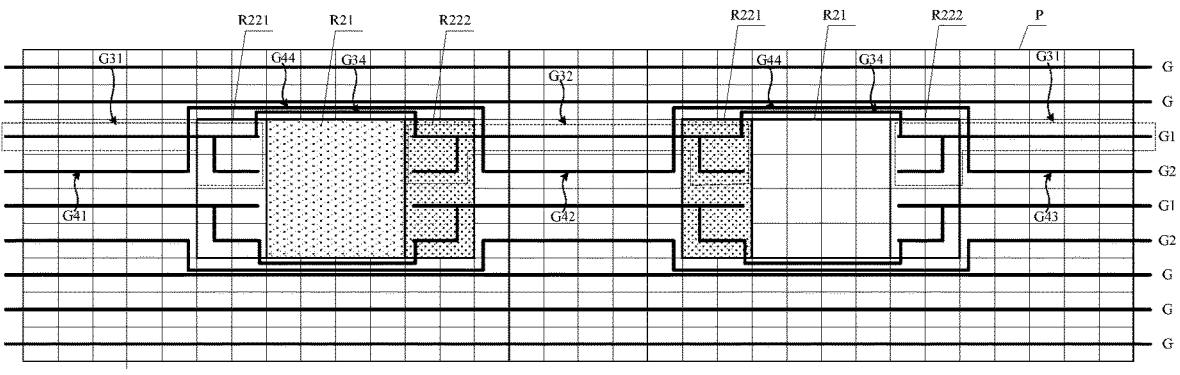
FIG. 26 is a first schematic diagram of a plurality of scan lines according to yet another exemplary embodiment.
Figure 27:
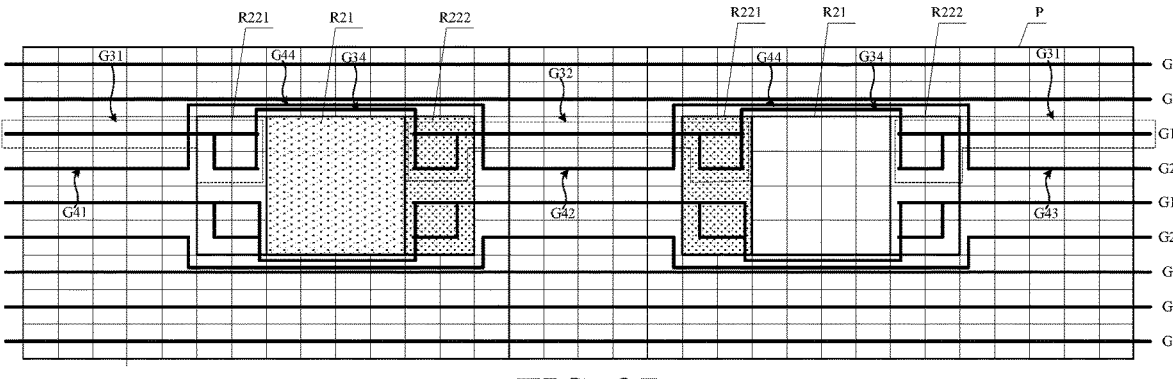
FIG. 27 is a second schematic diagram of a plurality of scan lines according to yet another exemplary embodiment.

FIG. 26 is a first schematic diagram of a plurality of scan lines according to yet another exemplary embodiment, FIG. 27 is a second schematic diagram of a plurality of scan lines according to yet another exemplary embodiment. As shown in FIGS. 26 and 27, when the number of the second display areas is at least two, and the pixel circuits of the sub-pixels of i-th row and (i+1)-th row located in the transition display area are connected with the first scan line G1, the first scan line G1 is respectively electrically connected with the pixel circuits of the sub-pixels of i-th row located in the first normal display area, the pixel circuits of the sub-pixels of i-th row located in the first transition display area R221 and the second transition display area R222 of all the second display areas, the pixel circuits of the sub-pixels of (i+1)-th row located in the first transition display area R221 and the second transition display area R222 of all the second display areas, the pixel circuits of the sub-pixels of i-th row of all the fifth normal display areas and the pixel circuits of the sub-pixels of i-th row located in the second normal display area. The second scan line may be electrically connected with the pixel circuits of the sub-pixels of (i+1)-th row located in the first normal display area, the pixel circuits of the sub-pixels of (i+1)-th row located in the second normal display area and the pixel circuits of the sub-pixels of (i+1)-th row located in all the fifth normal display areas;

In an exemplary embodiment, as shown in FIGS. 26 and 27, the first scan line may include a first scan portion G31, Q–1 second scan portions G32, a third scan portion G33, and Q first scan connection portions G34. The first scan portion G31 may be electrically connected with the pixel circuits of the sub-pixels of i-th row located in the first normal display area and the pixel circuits of the sub-pixels of i-th row and (i+1)-th row located in the first transition display area R221 of a first second display area, respectively. A t-th second scan portion G32 is electrically connected with the pixel circuits of the sub-pixels of i-th row of a t-th fifth normal display area, the pixel circuits of the sub-pixels i-th row and (i+1)-th row of the second transition display area of a t-th second display area, and the pixel circuits of the sub-pixels of i-th row and (i+1)-th row of the first transition display area of a (t+1)-th second display area, respectively, where t is a positive integer less than Q. The third scan portion G33 is electrically connected with the pixel circuits of the sub-pixels of i-th row and (i+1)-th row located in the second transition display area R222 of a Q-th second display area and the pixel circuits of the sub-pixels of i-th row of the second normal display area, respectively. A first scan connection portion G34 is electrically connected with the first scan portion G31 and a first second scan portion G32, respectively, and a t-th first scan connection portion G34 is electrically connected with a (t–1)-th second scan portion G32 and a t-th second scan portion G32, respectively; a Q-th first scan connection portion G34 is electrically connected with a (Q–1)-th second scan portion G32 and the third scan portion G33, respectively. FIGS. 26 and 27 are explained by taking Q=2 as an example.

In an exemplary embodiment, the first scan portion, the second scan portion, and the third scan portion may be open-loop or include a closed loop. When the first scan portion includes a closed loop, the first scan portion located in the transition display area is a closed loop. When the second scan portion includes a closed loop, the second scan portion located in the transition display area is a closed loop. When the third scan portion includes a closed loop, the third scan portion located in the transition display area is a closed loop. FIG. 26 is illustrated by taking an example in which the first scan portion, the second scan portion and the third scan portion are open loops. FIG. 27 is illustrated by taking an example in which the first scan portion, the second scan portion and the third scan portion includes a closed loop.

In an exemplary embodiment, the first scan portion, the second scan portion, and the third scan portion located in the transition display area being closed loops can reduce the load of the first scan line.

In an exemplary embodiment, as shown in FIGS. 26 and 27, the second scan line may include a fourth scan portion G41, Q–1 fifth scan portions G42, a sixth scan portion G43, and Q second scan connection portions G44. The fourth scan portion G41 may be electrically connected with the pixel circuits of the sub-pixels of (i+1)-th row located in the first normal display area. The t-th fifth scan portion G42 may be electrically connected with the pixel circuits of the sub-pixels of (i+1)-th row of a t-th fifth normal display area. The sixth scan portion G43 may be electrically connected with the pixel circuits of the sub-pixels of (i+1)-th row located in the second first display area. A first second scan connection portion G44 may be electrically connected with the first scan portion G41 and a first second scan portion G42, respectively, and a t-th second scan connection portion G44 may be electrically connected with a (t–1)-th second scan portion G32 and a t-th second scan portion G42, respectively; a Q-th second scan connection portion G44 may be electrically connected with a (Q–1)-th second scan portion G42 and the third scan portion G43, respectively.

Figure 28:
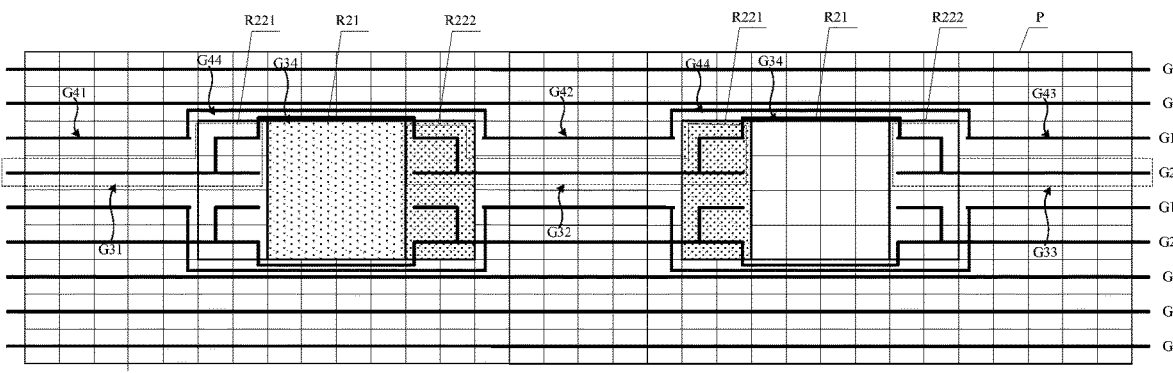
FIG. 28 is a third schematic diagram of a plurality of scan lines according to yet another exemplary embodiment.
Figure 29:
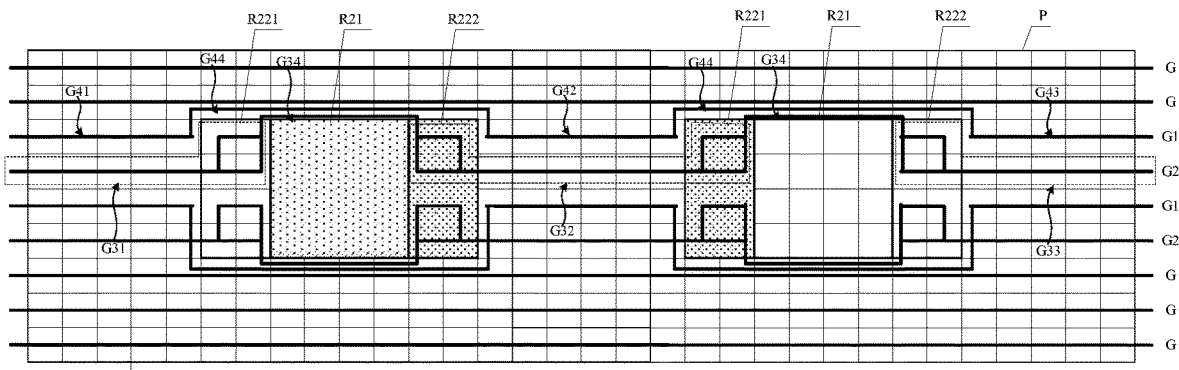
FIG. 29 is a fourth schematic diagram of a plurality of scan lines according to yet another exemplary embodiment.

FIG. 28 is a third schematic diagram of a plurality of scan lines according to yet another exemplary embodiment, FIG. 29 is a fourth schematic diagram of a plurality of scan lines according to yet another exemplary embodiment. As shown in FIGS. 28 and 29, when the number of the second display areas is at least two, and the pixel circuits of the sub-pixels of i-th row and (i+1)-th row located in the transition display area are connected with the second scan line G2, the first scan line G1 may be electrically connected with the pixel circuits of the sub-pixels of i-th row located in the first normal display area, the pixel circuits of the sub-pixels of i-th row located in the second normal display area, and the pixel circuits of the sub-pixels of i-th row located in all the fifth normal display areas, respectively. The second scan line G2 may be respectively connected with the pixel circuits of the sub-pixels of (i+1)-th row located in the first normal display area, the pixel circuits of the sub-pixels of i-th row and (i+1)th row located in the first transition display area R21 and the second transition display area R222 of all the second display areas, the pixel circuits of the sub-pixels of (i+1)-th row of all the fifth normal display areas and the pixel circuits of the sub-pixels of (i+1)-th row located in the second normal display area.

In an exemplary embodiment, as shown in FIGS. 28 and 29, the SECOND scan line may include a first scan portion G31, Q–1 second scan portions G32, a third scan portion G33, and Q first scan connection portions G34. The first scan portion G31 may be electrically connected with the pixel circuits of the sub-pixels of (i+1)-th row located in the first normal display area and the pixel circuits of the sub-pixels of i-th row and (i+1)-th row located in the first transition display area of a first second display area, respectively. a t-th second scan portion g32 may be electrically connected with the pixel circuits of the sub-pixels of (i+1)-th row of a t-th fifth normal display area, the pixel circuits of the sub-pixels of i-th row and (i+1)-th row of the second transition display area of a t-th second display area, and the pixel circuits of the sub-pixels of i-th row and (i+1)-th row of the first transition display area of a (t+1)-th second display area, respectively. The third scan portion G33 is electrically connected with the pixel circuits of the sub-pixels of i-th row and (i+1)-th row located in the second transition display area of a Q-th second display area and the sub-pixels of (i+1)-th row of the second normal display area, respectively. A first scan connection portion G34 is electrically connected with the first scan portion G31 and a first second scan portion G32, respectively, and a t-th first scan connection portion G34 is electrically connected with a (t−1)-th second scan portion G32 and a t-th second scan portion G32, respectively; a Q-th first scan connection portion G34 is electrically connected with a (Q−1)-th second scan portion G32 and the third scan portion G33, respectively. FIGS. 28 and 29 are explained by taking Q=2 as an example.

In an exemplary embodiment, the first scan portion, the second scan portion, and the third scan portion may be open-loop or include a closed loop. When the first scan portion includes a closed loop, the first scan portion located in the transition display area is a closed loop. When the second scan portion includes a closed loop, the second scan portion located in the transition display area is a closed loop. When the third scan portion includes a closed loop, the third scan portion located in the transition display area is a closed loop. The first scan portion, the second scan portion and the third scan portion including a closed loop can reduce the load of the first scan line. FIG. 28 is illustrated by taking an example in which the first scan portion, the second scan portion and the third scan portion are open loops. FIG. 29 is illustrated by taking an example in which the first scan portion, the second scan portion and the third scan portion includes a closed loop.

In an exemplary embodiment, the first scan portion, the second scan portion, and the third scan portion located in the transition display area being closed loops can reduce the load of the second scan line.

In an exemplary embodiment, as shown in FIGS. 28 and 29, the first scan line may include a fourth scan portion G41, Q−1 fifth scan portions G42, a sixth scan portion G43, and Q second scan connection portions G44. The fourth scan portion G41 may be electrically connected with the pixel circuits of the sub-pixels of i-th row located in the first normal display area. The t-th fifth scan portion G42 may be electrically connected with the pixel circuits of the sub-pixels of i-th row of a t-th fifth normal display area. The sixth scan portion G43 may be electrically connected with the pixel circuits of the sub-pixels of i-th row located in the second normal display area. A first second scan connection portion G44 is electrically connected with the first scan portion G41 and a first second scan portion G42, respectively, and a t-th second scan connection portion G44 is electrically connected with a (t−1)-th second scan portion G42 and a t-th second scan portion G42, respectively; a Q-th second scan connection portion G44 is electrically connected with a (Q−1)-th second scan portion G42 and the third scan portion G43, respectively.

In an exemplary embodiment, when the number of second display areas is at least two, the scan lines in the display substrate may be driven unilaterally or bilaterally. When the scan line is driven unilaterally, the display effect of the display substrate can be improved.

FIG. 10 to FIG. 29 are illustrated by taking an example in which the light transmitting display area includes four rows and four columns of pixel units. Each pixel unit includes: sub-pixels of at least three different colors. The present disclosure is not limited thereto.

As shown in FIGS. 10 to 29, an orthographic projection of the first scan line on the base substrate and an orthographic projection of the second scan line on the base substrate may have an overlapped area or may not have an overlapped area, which is determined by the structures of the first scan line and the second scan line, and is not limited in the present disclosure.

In an exemplary embodiment, the first scan line and the second scan line are disposed in the same layer when there is no overlapped area between the orthographic projection of the first scan line on the base substrate and the orthographic projection of the second scan line on the base substrate.

In an exemplary embodiment, when the orthographic projection of the first scan line on the base substrate and the orthographic projection of the second scan line on the base substrate have an overlapped area, the first scan line may include a first non-overlapped portion and a first overlapped portion, the first non-overlapped portion is disposed in the same layer as the second scan line, and the first overlapped portion may be disposed at a side of the second scan line close to the base substrate, or may be disposed at a side of the second scan line away from the base substrate. The first non-overlapped portion is a portion where the first scan line is not overlapped with the second scan line, and the first overlapped portion is a portion where the first scan line is overlapped with the second scan line.

In an exemplary embodiment, when the orthographic projection of the first scan line and the second scan line on the base substrate and the orthographic projection of the second scan line on the base substrate have an overlapped area, the second scan line may include a second non-overlapped portion and a second overlapped portion, the second non-overlapped portion is disposed in the same layer as the first scan line, and the second overlapped portion may be disposed at a side of the first scan line close to the base substrate, or may be disposed at a side of the first scan line away from the base substrate. The second non-overlapped portion is a portion where the second scan line is not overlapped with the first scan line, and the second overlapped portion is a portion where the second scan line is overlapped with the first scan line.

Figures 30, 31:
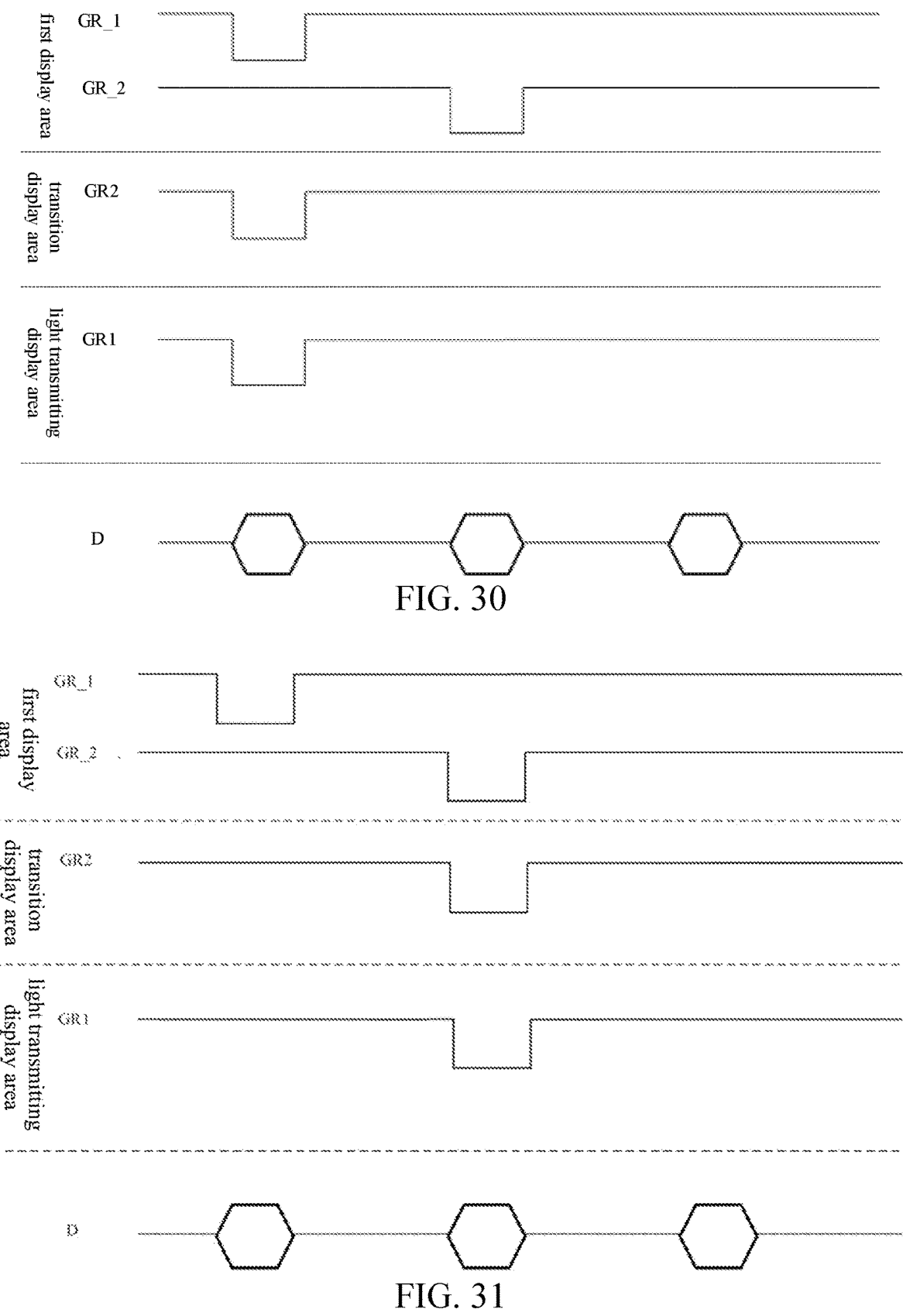
FIG. 30 is a sequence diagram of a part of signals according to an exemplary embodiment.
FIG. 31 is a sequence diagram of a part of signals according to another exemplary embodiment.

FIG. 30 is a sequence diagram of a part of signals according to an exemplary embodiment, FIG. 31 is a sequence diagram of a part of signals according to another exemplary embodiment. FIG. 30 is illustrated by taking an example in which the pixel circuits of the sub-pixels of i-th row and (i+1)-th row located in the transition display area are electrically connected with the first scan line, FIG. 31 is illustrated by taking an example in which the pixel circuits of the sub-pixels of i-th row and (i+1)-th row located in the transition display area are electrically connected with the second scan line. GR1 in FIGS. 30 and 31 is a scan signal connected with the pixel circuits connected with the sub-pixels of i-th row and (i+1)-th row in the light transmitting display area, GR2 is a scan signal connected with the pixel circuits connected with the sub-pixels of i-th row and (i+1)-th row in the transition display area, GR_1 is a scan signal of a scan line connected with the pixel circuits of the sub-pixels located in the first display area and in the same row as the i-th row in the transition display area, and GR_2 is a scan signal of a scan line connected with the pixel circuit of the sub-pixels located in the first display area and in the same row as the (i+1)-th row in the transition display area. D is the data signal of the data line. As shown in FIG. 30, GR1 and GR2 are identical to GR_1 when the pixel circuits of the sub-pixels of i-th row and (i+1)-th row of the transition display area are electrically connected with the first scan line. As shown in FIG. 31, GR1 and GR2 are identical to GR_1 when the pixel circuits of the sub-pixels of i-th row and (i+1)-th row of the transition display area are electrically connected with the first scan line.

An embodiment of the present disclosure also provides a display apparatus which may include a display substrate.

The display substrate is the display substrate according to any of the aforementioned embodiments, and has similar implementation principles and implementation effects, which will not be repeated here.

In an exemplary embodiment, the display apparatus may further include a functional component located in the light transmitting display area and located at a non-light-emitting side of the display apparatus. External ambient light can be emitted into the functional component through the light transmitting display area.

In an exemplary embodiment, the functional component may include at least one of a camera module (e.g., a front camera module), a 3D structured light module (e.g., 3D structured light sensor), a time-of-flight 3D imaging module (e.g., a time-of-flight sensor), an infrared sensing module (e.g., an infrared sensing sensor), and the like.

In an exemplary embodiment, the front camera module is typically enabled when a user takes a selfie or video call, and the display area of the display apparatus displays the image obtained by the selfie for the user to view. The front camera module includes, for example, a lens, an image sensor, an image processing chip, and the like. An optical image of a scene generated by the lens is projected onto a surface of the image sensor (the image sensor includes CCD and CMOS) and converted into electrical signals, which are converted into digital image signals after analog-to-digital conversion by the image processing chip, and then sent to the processor for processing, and the image of the scene is output on the display screen.

In an exemplary embodiment, a 3D structured light sensor and a Time of Flight (ToF) sensor may be used for face recognition to unlock the display apparatus.

For example, the functional component may only include a camera module to realize the function of selfie or video call; for example, the functional component may also include a 3D structured light module or a time-of-flight 3D imaging module to realize face recognition unlocking, and the like, which is included but not limited thereto in the present disclosure.

The display apparatus provided by an embodiment of the present disclosure can display images in the light transmitting display area to maintain the display integrity of the whole display apparatus.

The accompanying drawings of the present disclosure only involve the structures involved in the embodiments of the present disclosure, and other structures may refer to usual designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, the element may be "directly" located "on" or "under" the other element, or there may be an intermediate element.

Although the implementation modes disclosed in the present disclosure are as above, the described contents are only implementation modes used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a display area and a non-display area surrounding the display area, wherein the display area comprises a plurality of scan lines extending along a first direction and a plurality of sub-pixels arranged in an array, the display area comprises a first display area and a second display area, the first display area is located at a periphery of the second display area, and the second display area comprises a light transmitting display area and a transition display area, the transition display area is located at a side of the light transmitting display area;

the light transmitting display area comprises m rows and n columns of sub-pixels, each sub-pixel located in the light transmitting display area comprises a light emitting element, a light emitting element of each sub-pixel of i-th row located in the light transmitting display area is electrically connected with a light emitting element of a sub-pixel of (i+1)-th row with the same color located in the light transmitting display area, and i is an odd number less than or equal to m;

the transition display area comprises m rows and n columns of sub-pixels, and sub-pixels of i-th row of the light transmitting display area and sub-pixels of i-th row of the transition display area are located in the same row; each sub-pixel located in the transition display area comprises a pixel circuit and a light emitting element, a light emitting element of each sub-pixel of i-th row located in the transition display area is electrically connected with a light emitting element of a sub-pixel of (i+1)-th row with the same color located in the transition display area; pixel circuits and light emitting elements of the sub-pixels of i-th row located in the transition display area are electrically connected, and a pixel circuit of a sub-pixel of (i+1)-th row and j-th column located in the transition display area is electrically connected with a light emitting element of a sub-pixel of (i+1)-th row and j-th column located in the light transmitting display area, and j is a positive integer less than or equal to n; and pixel circuits of sub-pixels of i-th row and (i+1)-th row located in the transition display area are connected with the same scan line; wherein the first display area comprises a plurality of sub-pixels, and each sub-pixel located in the first display area comprises a pixel circuit and a light emitting element; at least three sub-pixels located in the same row form a pixel unit; each light emitting element comprises an anode, an organic light emitting layer and a cathode;

an anode of a light emitting element of each sub-pixel in a pixel unit of i-th row and k-th column located in the light transmitting display area is electrically connected with an anode of a light emitting element of a sub-pixel with the same color in a pixel unit of (i+1)-th row and k-th column located in the light transmitting display area, where k is a positive integer less than or equal to K, K=n/3 or n/4;

an anode of a light emitting element of each sub-pixel in a pixel unit of i-th row and k-th column located in the transition display area is electrically connected with an anode of a light emitting element of a sub-pixel with the same color in a pixel unit of (i+1)-th row and k-th column located in the transition display area;

the pixel circuit of the sub-pixel of (i+1)-th row and i-th column located in the transition display area is electrically connected with an anode of the light emitting element of the sub-pixel of (i+1)-th row and i-th column located in the light transmitting display area;

a pixel circuit and an anode of a light emitting element of a sub-pixel located in the first display area are electrically connected;

the display substrate further comprises a plurality of data lines extending along a second direction, wherein a pixel circuit of a sub-pixel of i-th row and i-th column located in the transition display area is electrically connected with a first data line, the pixel circuit of the sub-pixel of (i+1)-th row and i-th column located in the transition display area is electrically connected with a second data line, the first direction and the second direction intersect;

the first data line is a data line connected with a pixel circuit of a sub-pixel that is located in the first display area and is in the same column as the sub-pixel of i-th row and j-th column located in the transition display area; the second data line is a data line connected with a pixel circuit of a sub-pixel that is located in the first display area and is in the same column as the sub-pixel of (i+1)-th row and j-th column located in the light transmitting display area;

the display substrate further comprises a data connection line arranged in a different layer from the data line;

the data connection line is electrically connected with the pixel circuit of the sub-pixel of (i+1)-th row and j-th column located in the transition display area and a second data line connected with the pixel circuit of the sub-pixel of (i+1)-th row and j-th column located in the transition display area.

2. The display substrate according to claim 1, wherein the pixel circuits of the sub-pixels of i-th row and (i+1)-th row located in the transition display area are connected with a first scan line or a second scan line; and the first scan line is a scan line connected with a sub-pixel that is located in the first display area and is in the same row as the sub-pixels of i-th row located in the transition display area; the second scan line is a scan line a scan line connected with a sub-pixel that is located in the first display area and is in the same row as a sub-pixel of (i+1)-th row located in the transition display area.

3. The display substrate according to claim 2, wherein the light transmitting display area comprises a first side and a second side oppositely disposed, and a third side and a fourth side oppositely disposed; the transition display area comprises a first transition display area and a second transition display area; and the first transition display area is located at the first side of the light transmitting display area, the second transition display area is located at the second side of the light transmitting display area, and the first transition display area and the second transition display area are arranged along the first direction.

4. The display substrate according to claim 3, wherein the number of the second display area is at least one.

5. The display substrate according to claim 4, wherein, when the number of second display areas is one, the first display area comprises a first normal display area, a second normal display area, a third normal display area, and a fourth normal display area;

a k-th row of the first normal display area is the same row as a k-th row of the light transmitting display area, and a k-th row of the second normal display area is the same row as a k-th row of the light transmitting display area, where k is a positive integer greater than or equal to 1 and less than or equal to m; and the first normal display area is located at a side of the first transition display area away from the light transmitting display area, and the second normal display area is located at a side of the second transition display area away from the light transmitting display area; the third normal display area is located at a third side of the light transmitting display area, and the fourth normal display area is located at a fourth side of the light transmitting display area; the third normal display area and the fourth normal display area are arranged along the second direction.

6. The display substrate according to claim 5, wherein, when the pixel circuits of the sub-pixels of i-th row and (i+1)-th row in the transition display area are connected with the first scan line, the first scan line comprises a first scan portion and a second scan portion arranged at intervals, the second scan line comprises a third scan portion and a fourth scan portion arranged at intervals and extending along the first direction;

the first scan portion is electrically connected with the pixel circuits of the sub-pixels of i-th row and (i+1)-th row located in the first transition display area and the pixel circuits of the sub-pixels of i-th row located in the first normal display area, respectively;

the second scan portion is electrically connected with the pixel circuits of the sub-pixels of i-th row and (i+1)-th row located in the second transition display area and the pixel circuits of the sub-pixels of i-th row located in the second normal display area, respectively;

the third scan portion is electrically connected with the pixel circuits of the sub-pixels of (i+1)-th row located in the first normal display area; and the fourth scan portion is electrically connected with the pixel circuits of the sub-pixels of (i+1)-th row located in the second normal display area.

7. The display substrate according to claim 6, wherein the first scan portion comprises a first connection portion, a second connection portion and a third connection portion, the first connection portion and the third connection portion extend along the first direction, the second connection portion extends along the second direction;

the first connection portion is electrically connected with the pixel circuits of the sub-pixels of i-th row located in the first normal display area, the pixel circuits of the sub-pixels of i-th row located in the first transition display area and the second connection portion; the second connection portion is electrically connected with the third connection portion; the third connection portion is electrically connected with the pixel circuits of the sub-pixels of (i+1)-th row located in the first transition display area;

the second scan portion comprises a fourth connection portion, a fifth connection portion and a sixth connection portion, the fourth connection portion and the sixth connection portion extend along the first direction and the fifth connection portion extends along the second direction; and the fourth connection portion is electrically connected with the pixel circuits of the sub-pixels of i-th row located in the second normal display area, the pixel circuits of the sub-pixels of i-th row located in the second transition display area and the fifth connection portion, respectively; the fifth connection portion is electrically connected with the sixth connection portion; the sixth connection portion is electrically connected with the pixel circuits of the sub-pixels of (i+1)-th row located in the second transition display area.

8. The display substrate of claim 7, wherein the first scan portion further comprises a seventh connection portion extending along the second direction, the second scan portion further comprises an eighth connection portion extending along the second direction;

the seventh connection portion is electrically connected with the first connection portion and the third connection portion, respectively; and the eighth connection portion is electrically connected with the fourth connection portion and the sixth connection portion, respectively.

9. The display substrate according to claim 7, wherein the first scan line further comprises a first scan connection portion; and the first scan connection portion is electrically connected with the first scan portion and the second scan portion, respectively.

10. The display substrate according to claim 7, wherein the second scan line further comprises a second scan connection portion; and the second scan connection portion is electrically connected with the third scan portion and the fourth scan portion, respectively.

11. The display substrate according to claim 5, wherein, when the pixel circuits of the sub-pixels of i-th row and (i+1)-th row in the transition display area are connected with the second scan line, the second scan line comprises a first scan portion and a second scan portion arranged at intervals, the first scan line comprises a third scan portion and a fourth scan portion arranged at intervals and extending along the first direction;

the first scan portion is electrically connected with the pixel circuits of the sub-pixels of i-th row and (i+1)-th row located in the first transition display area and the pixel circuits of the sub-pixels of (i+1)-th row located in the first normal display area, respectively;

the second scan portion is electrically connected with the pixel circuits of the sub-pixels of i-th row and (i+1)-th row located in the second transition display area and the pixel circuits of the sub-pixels of (i+1)-th row located in the second normal display area, respectively;

the third scan portion is electrically connected with the pixel circuits of the sub-pixels of i-th row located in the first normal display area; and the fourth scan portion is electrically connected with the pixel circuits of the sub-pixels of i-th row located in the second normal display area.

12. The display substrate according to claim 11, wherein the first scan portion comprises a first connection portion, a second connection portion and a third connection portion, the first connection portion and the third connection portion extends along the first direction, the second connection portion extends along the second direction; the first connection portion is electrically connected with the pixel circuits of the sub-pixels of (i+1)-th row located in the first normal display area, the pixel circuits of the sub-pixels of (i+1)-th row located in the first transition display area and the second connection portion; the second connection portion is electrically connected with the third connection portion; the third connection portion is electrically connected with the pixel circuits of the sub-pixels of i-th row located in the first transition display area; and the second scan portion comprises a fourth connection portion, a fifth connection portion and a sixth connection portion, the fourth connection portion and the sixth connection portion extend along the first direction, the fifth connection portion extends along the second direction; the fourth connection portion is electrically connected with the pixel circuits of the sub-pixels of (i+1)-th row located in the second normal display area, the pixel circuits of the sub-pixels of (i+1)-th row located in the second transition display area and the fifth connection portion, respectively; the fifth connection portion is electrically connected with the sixth connection portion; the sixth connection portion is electrically connected with the pixel circuits of the sub-pixels of i-th row located in the second transition display area.

13. The display substrate according to claim 12, wherein, the first scan portion further comprises a seventh connection portion extending along the second direction, and the seventh connection portion is electrically connected with the first connection portion and the third connection portion, respectively; and the second scan portion further comprises an eighth connection portion extending along the second direction, and the eighth connection portion is electrically connected with the fourth connection portion and the sixth connection portion, respectively;

wherein the second scan line further comprises a first scan connection portion; and the first scan connection portion is electrically connected with the first scan portion and the second scan portion, respectively;

wherein the first scan line further comprises a second scan connection portion; and the second scan connection portion is electrically connected with the third scan portion and the fourth scan portion, respectively.

14. The display substrate according to claim 4, wherein, when the number of second display areas is at least two, the first display area comprises a first normal display area, a second normal display area, a third normal display area, a fourth normal display area, and Q−1 fifth normal display areas; a k-th row of the first normal display area is the same row as a k-th row of the light transmitting display area, a k-th row of the second normal display area is the same row as a k-th row of the light transmitting display area, a k-th row of the fifth normal display area is the same row as a k-th row of the light transmitting display area, where k is a positive integer greater than or equal to 1 and less than or equal to m, and Q is the number of the second display area; and the first normal display area is located at a side of the first transition display area away from the light transmitting display area, and the second normal display area is located at a side of the second transition display area away from the light transmitting display area; the third normal display area is located at a third side of the light transmitting display area, and the fourth normal display area is located at a fourth side of the light transmitting display area; the third normal display area and the fourth normal display area are arranged along the second direction; an i-th fifth normal display area is located between an i-th second display area and an (i+1)-th second display area.

15. The display substrate according to claim 14, wherein when the pixel circuits of the sub-pixels of i-th row and (i+1)-th row in the transition display area are connected with the first scan line, the first scan line is respectively electrically connected with the pixel circuits of the sub-pixels of i-th row located in the first normal display area, the pixel circuits of the sub-pixels of i-th row located in the first transition display area and the second transition display area of all the second display areas, the pixel circuits of the sub-pixels of (i+1)-th row located in the first transition display area and the second transition display area of all the second display areas, the pixel circuits of the sub-pixels of i-th row of all the fifth normal display areas and the pixel circuits of the sub-pixels of i-th row located in the second normal display area;

the second scan line is electrically connected with the pixel circuits of the sub-pixels of (i+1)-th row located in the first normal display area, the pixel circuits of the sub-pixels of (i+1)-th row located in the second normal display area and the pixel circuits of the sub-pixels of (i+1)-th row located in all the fifth normal display areas;

the first scan line comprises a first scan portion, Q−1 second scan portions and a third scan portion, and Q first scan connection portions;

the first scan portion is electrically connected with the pixel circuits of the sub-pixels of i-th row located in the first normal display area, and the pixel circuits of the sub-pixels of i-th row and (i+1)-th row located in the first transition display area of a first second display area;

a t-th second scan portion is electrically connected with the pixel circuits of the sub-pixels of i-th row of a t-th fifth normal display area, the pixel circuits of the sub-pixels i-th row and (i+1)-th row of the second transition display area of a t-th second display area, and the pixel circuits of the sub-pixels of i-th row and (i+1)-th row of the first transition display area of a (t+1)-th second display area, respectively, where t is a positive integer less than Q;

the third scan portion is electrically connected with the pixel circuits of the sub-pixels of i-th row and (i+1)-th row located in the second transition display area of a Q-th second display area and the sub-pixels of i-th row of the second normal display area, respectively;

a first scan connection portion is electrically connected with the first scan portion and a first second scan portion, respectively, and a t-th first scan connection portion is electrically connected with a (t−1)-th second scan portion and a t-th second scan portion, respectively; a Q-th first scan connection portion is electrically connected with a (Q−1)-th second scan portion and the third scan portion respectively;

the second scan line comprises a fourth scan portion, Q−1 fifth scan portions and a sixth scan portion, and Q second scan connection portions;

the fourth scan portion is electrically connected with the pixel circuits of the sub-pixels of (i+1)-th row located in the first normal display area;

a t-th fifth scan portion is electrically connected with the pixel circuits of the sub-pixels of (i+1)-th row of a t-th fifth normal display area;

the sixth scan portion is electrically connected with the pixel circuits of the sub-pixels of (i+1)-th row located in the second first display area; and a first second scan connection portion is electrically connected with the first scan portion and a first second scan portion, respectively, and a t-th second scan connection portion is electrically connected with a (t−1)-th second scan portion and a t-th second scan portion, respectively; a Q-th second scan connection portion is electrically connected with a (Q−1)-th second scan portion and the third scan portion respectively.

16. The display substrate according to claim 14, wherein when the pixel circuits of the sub-pixels of i-th row and (i+1)-th row in the transition display area are connected with the second scan line, the first scan line is electrically connected with the pixel circuits of the sub-pixels of i-th row located in the first normal display area, the pixel circuits of the sub-pixels of i-th row located in the second normal display area and the pixel circuits of the sub-pixels of i-th row located in all the fifth normal display areas;

the second scan line is respectively connected with the pixel circuits of the sub-pixels of (i+1)-th row located in the first normal display area, the pixel circuits of the sub-pixels of i-th row and (i+1)th row located in the first transition display area and the second transition display area of all the second display areas, the pixel circuits of the sub-pixels of (i+1)-th row of all the fifth normal display areas and the pixel circuits of the sub-pixels of (i+1)-th row located in the second normal display area;

the second scan line includes a first scan portion, Q−1 second scan portions and a third scan portion, and Q first scan connection portions;

the first scan portion is electrically connected with the pixel circuits of the sub-pixels of (i+1)-th row located in the first normal display area, and the pixel circuits of the sub-pixels of i-th row and (i+1)-th row located in the first transition display area of the first second display area;

a t-th second scan portion is electrically connected with the pixel circuits of the sub-pixels of (i+1)-th row of a t-th fifth normal display area, the pixel circuits of the sub-pixels i-th row and (i+1)-th row of the second transition display area of a t-th second display area, and the pixel circuits of the sub-pixels of i-th row and (i+1)-th row of the first transition display area of a (t+1)-th second display area, respectively;

the third scan portion is electrically connected with the pixel circuits of the sub-pixels of i-th row and (i+1)-th row located in the second transition display area of a Q-th second display area and the sub-pixels of (i+1)-th row of the second normal display area, respectively;

a first scan connection portion is electrically connected with the first scan portion and a first second scan portion, respectively, and a t-th second scan connection portion is electrically connected with a (t−1)-th second scan portion and a t-th second scan portion, respectively; a Q-th second scan connection portion is electrically connected with a (Q−1)-th second scan portion and the third scan portion respectively;

the first scan line comprises a fourth scan portion, Q−1 fifth scan portions, a sixth scan portion and Q second scan connection portions;

the fourth scan portion is electrically connected with the pixel circuits of the sub-pixels of i-th row located in the first normal display area;

a t-th fifth scan portion is electrically connected with the pixel circuits of the sub-pixels of i-th row of a t-th fifth normal display area;

the sixth scan portion is electrically connected with the pixel circuits of the sub-pixels of i-th row located in the second normal display area; and a first second scan connection portion is electrically connected with the first scan portion and a first second scan portion, respectively, and a t-th second scan connection portion is electrically connected with a (t−1)-th second scan portion and a t-th second scan portion, respectively; a Q-th second scan connection portion is electrically connected with a (Q−1)-th second scan portion and the third scan portion respectively.

17. A display apparatus, comprising: the display substrate of claim 1.

* * * * *